United States Patent
Singh et al.

(10) Patent No.: US 10,886,165 B2
(45) Date of Patent: Jan. 5, 2021

(54) METHOD OF FORMING NEGATIVELY SLOPED ISOLATION STRUCTURES

(71) Applicant: Taiwan Semiconductor Manufacturing Company, Ltd., Hsinchu (TW)

(72) Inventors: Gulbagh Singh, Uttar Pradesh (IN); Tsung-Han Tsai, Zhunan Township (TW); Kun-Tsang Chuang, Miaoli (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/009,450

(22) Filed: Jun. 15, 2018

(65) Prior Publication Data
US 2019/0385892 A1    Dec. 19, 2019

(51) Int. Cl.
| H01L 29/00 | (2006.01) |
| H01L 21/764 | (2006.01) |
| H01L 29/06 | (2006.01) |
| H01L 21/306 | (2006.01) |
| H01L 21/762 | (2006.01) |
| H01L 21/3065 | (2006.01) |
| H01L 21/308 | (2006.01) |

(52) U.S. Cl.
CPC .......... *H01L 21/764* (2013.01); *H01L 21/308* (2013.01); *H01L 21/3065* (2013.01); *H01L 21/30604* (2013.01); *H01L 21/76224* (2013.01); *H01L 29/0649* (2013.01)

(58) Field of Classification Search
None
See application file for complete search history.

(56) References Cited

U.S. PATENT DOCUMENTS

| 6,514,805 | B2 * | 2/2003 | Xu ................... H01L 21/76229 |
| | | | 257/E21.548 |
| 9,000,555 | B2 | 4/2015 | Liu et al. |
| 2008/0149969 | A1 | 6/2008 | Suzuki et al. |
| 2009/0045482 | A1 | 2/2009 | Liaw et al. |
| 2012/0049318 | A1 | 3/2012 | Kawamata et al. |
| 2012/0261792 | A1 | 10/2012 | Cheng et al. |
| 2013/0175661 | A1 * | 7/2013 | Cai ................... H01L 21/76232 |
| | | | 257/506 |
| 2015/0130016 | A1 | 5/2015 | Kao |
| 2019/0341295 | A1 * | 11/2019 | Sung ................... H01L 21/3065 |

FOREIGN PATENT DOCUMENTS

JP    2015084438 A    4/2015

* cited by examiner

*Primary Examiner* — Hung K Vu
(74) *Attorney, Agent, or Firm* — Slater Matsil, LLP

(57) ABSTRACT

Negatively sloped isolation structures are formed on a semiconductor substrate to isolate devices from one another. The negatively sloped isolation structures have a top critical dimension which is smaller than a bottom critical dimension. The negatively sloped isolation structures may penetrate through an insulator layer of a silicon-on-insulator structure arrangement.

20 Claims, 24 Drawing Sheets

METHOD OF FORMING NEGATIVELY SLOPED ISOLATION STRUCTURES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As the density of semiconductor technologies increases, the risk of unwanted cross-talk between electronic components also increases. As such, there has grown a need for more creative ways to avoid noise coupling of adjacent devices to maintain isolation while allowing for fabrication of smaller devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
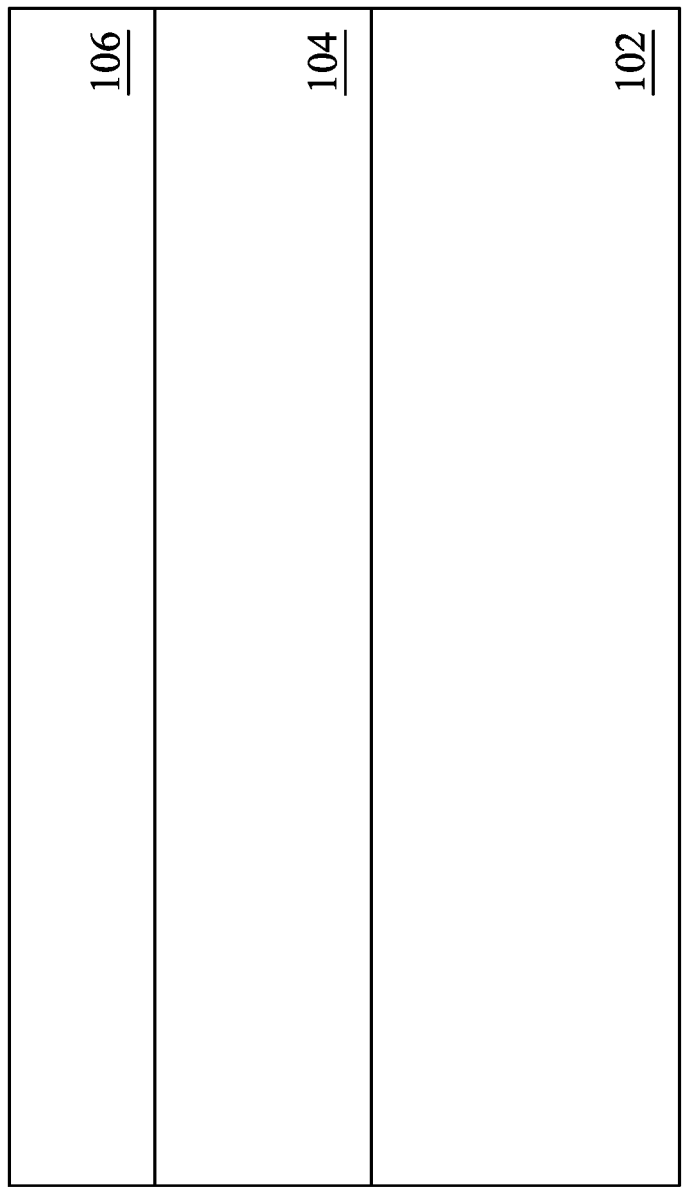
FIGS. 1 through 7 illustrate cross-sectional views of intermediate steps of the manufacture of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provide a negatively sloped isolation structure, such as a shallow trench isolation, between devices formed on a semiconductor substrate. In devices formed with positively sloped isolation structures, as the isolation structure tapers into the substrate, adjacent devices get closer to each other. The negatively sloped isolation structures of the present embodiments allow devices to be formed closer together without increasing coupling effects and leakage from one device to another, or allow devices to be formed at the same critical dimensions while improving isolation properties between devices. One application of the negatively sloped isolation structures described herein may be in radio frequency (RF) devices. Strong isolation may especially be important RF device applications, where devices are especially sensitive to close-talk (also referred to as cross-talk) from other nearby devices.

FIGS. 1 through 7 illustrate cross-sectional views of intermediate steps of the manufacture of a semiconductor device, in accordance with some embodiments. FIG. 1 illustrates a substrate 102. Although the techniques described below are done so in terms of a silicon on insulator (SOI) arrangement, one of skill will understand that these techniques may be applied to other substrate arrangements, such as a bulk semiconductor.

Substrate 102 may be a semiconductor substrate or glass substrate. Other substrates, such as a multi-layered or gradient substrate may also be used. Substrate 102 may be a wafer, such as a silicon wafer. Insulator layer 104 is formed over substrate 102 and may be, for example, a buried oxide (BOX) layer, a silicon oxide layer, or the like. A top semiconductor layer 106 is formed over insulator layer 104. Top semiconductor layer 106 may be doped (e.g., with a p-type or an n-type dopant) or undoped. In some embodiments, the semiconductor material of the top semiconductor layer 106 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like.

In some embodiments the material of top semiconductor layer 106 may be the same as the material of substrate 102, while in other embodiments, the material of top semiconductor layer 106 may be different from the material of substrate 102. Insulator layer 104 may be formed by any suitable means. For example, insulator layer 104 may be formed as a separate layer on top of substrate 102 or may be formed by an oxidation technique, such as through ion beam implantation of oxygen followed by a high temperature annealing, or by oxidizing a semiconductor wafer and bonding the oxidized wafer to substrate 102.

In some embodiments, appropriate wells (not shown) may be formed in top semiconductor layer 106. In some embodiments, where the resulting device is an n-type device, the wells are p-wells. In some embodiments, where the resulting device is a p-type device, the wells are n-wells. In other embodiments, both p-wells and n-wells are formed in top semiconductor layer 106. In some embodiments, p-type impurities are implanted into top semiconductor layer 106 to form the p-wells. The p-type impurities may be boron, $BF_2$, or the like, and may be implanted to a concentration of equal to or less than 1018 $cm^{-3}$, such as in a range from about $10^{17}$ $cm^{-3}$ to about 1018 $cm^{-3}$. In some embodiments, n-type impurities are implanted into top semiconductor layer 106 to form the n-wells. The n-type impurities may be phosphorus, arsenic, or the like, and may be implanted to a concentration of equal to or less than 1018 $cm^{-3}$, such as in a range from about $10^{17}$ $cm^{-3}$ to about 1018 $cm^{-3}$. After implanting the appropriate impurities, an anneal may be performed on the substrate to activate the p-type and n-type impurities that were implanted.

Figure 2:
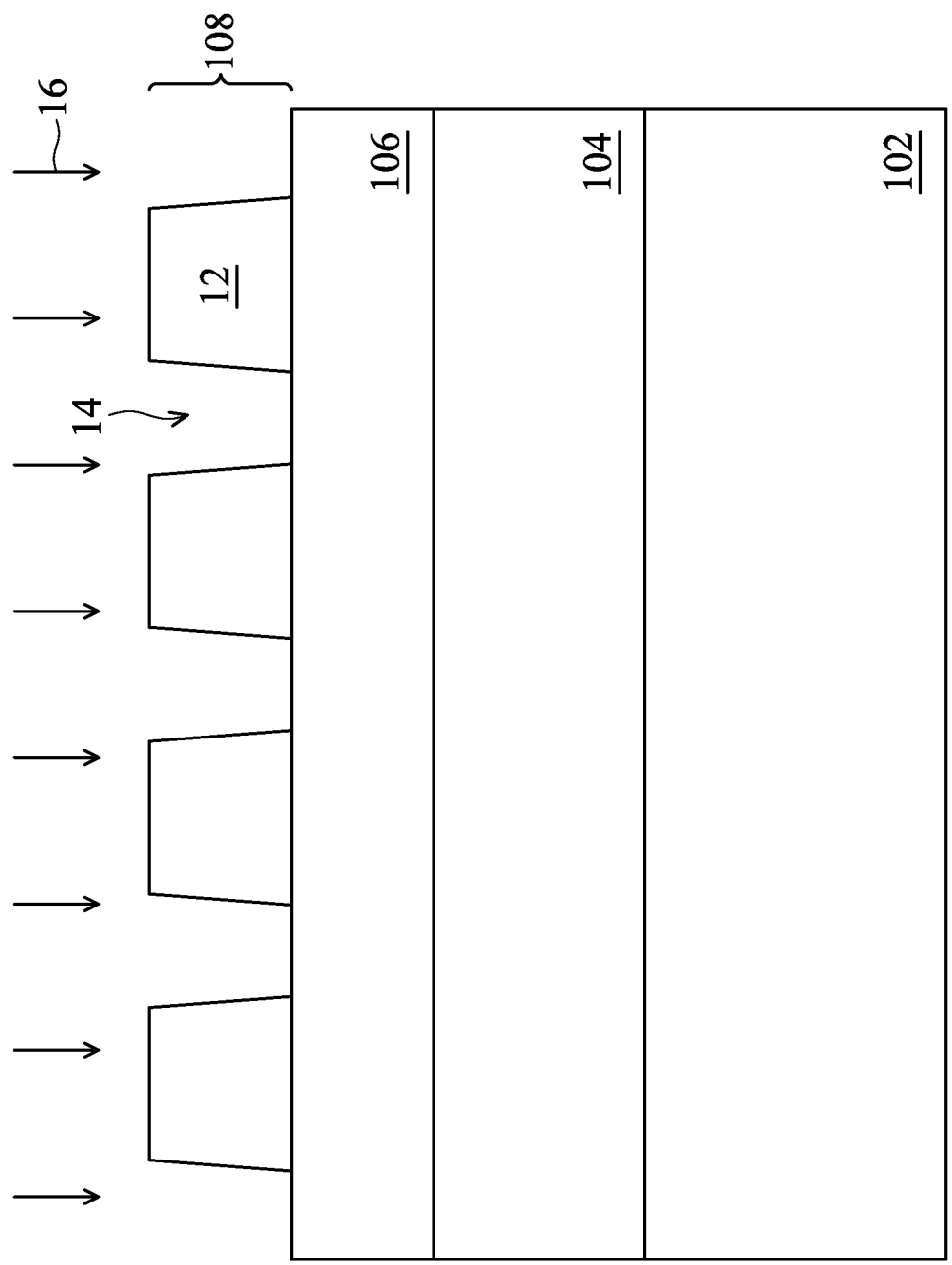

FIG. 2 illustrates the formation of a mask 108 over top semiconductor layer 106. Mask 108 is used in a subsequent etching step to pattern the top semiconductor layer 106 (see FIG. 3). In some embodiments, mask 108 may comprise one or more mask layers. For example, in some embodiments, mask 108 may include a tri-layer or bi-layer mask having a topmost layer that is photo-patternable. A bottommost layer of mask layer 108 may be a hard mask layer comprising silicon oxide, silicon nitride, silicon oxynitride, silicon carbide, silicon carbonitride, a combination thereof, or the like, and may be formed using any suitable process, such as thermal oxidation, thermal nitridation, atomic layer deposition (ALD), physical vapor deposition (PVD), chemical vapor deposition (CVD), a combination thereof, or the like. The bottommost layer of mask 108 may be used to prevent or minimize etching of the top semiconductor layer 106 underlying the bottommost layer of mask 108 in the subsequent etch step (see FIG. 3). The topmost layer of mask 108 may comprise photoresist, and in some embodiments, may be used to pattern the bottommost layer of mask 108 for use in the subsequent etching step. The topmost layer of mask 108 may be formed by using a spin-on technique and may be patterned using acceptable photolithography techniques. In some embodiments, the mask 108 may comprise additional mask layers.

Mask 108 is patterned to provide a patterned mask 12 and openings 14 by one or more patterning processes 16. Openings 14 correspond to areas of top semiconductor layer 106 in which an isolation structure will be formed. Patterned mask 12 remains to mask top semiconductor layer 106 from etching processes which will form trenches in top semiconductor layer 106. Patterning processes 16 may include combinations of photo-patterning processes and etching processes, depending on the materials and layer composition of mask 108, as discussed above. For example, to form openings in a topmost photo-patternable layer of mask 108, a photo-patterning process may be used. Next, an etching process may be used to extend the pattern of the openings in the topmost layer to a subsequent layer, while using the topmost layer as a mask to protect the portions of the subsequent layer that should not be etched. Patterning processes 16 may be chosen to be selective to the materials being patterned, such that little to no over patterning occurs.

Figure 3:
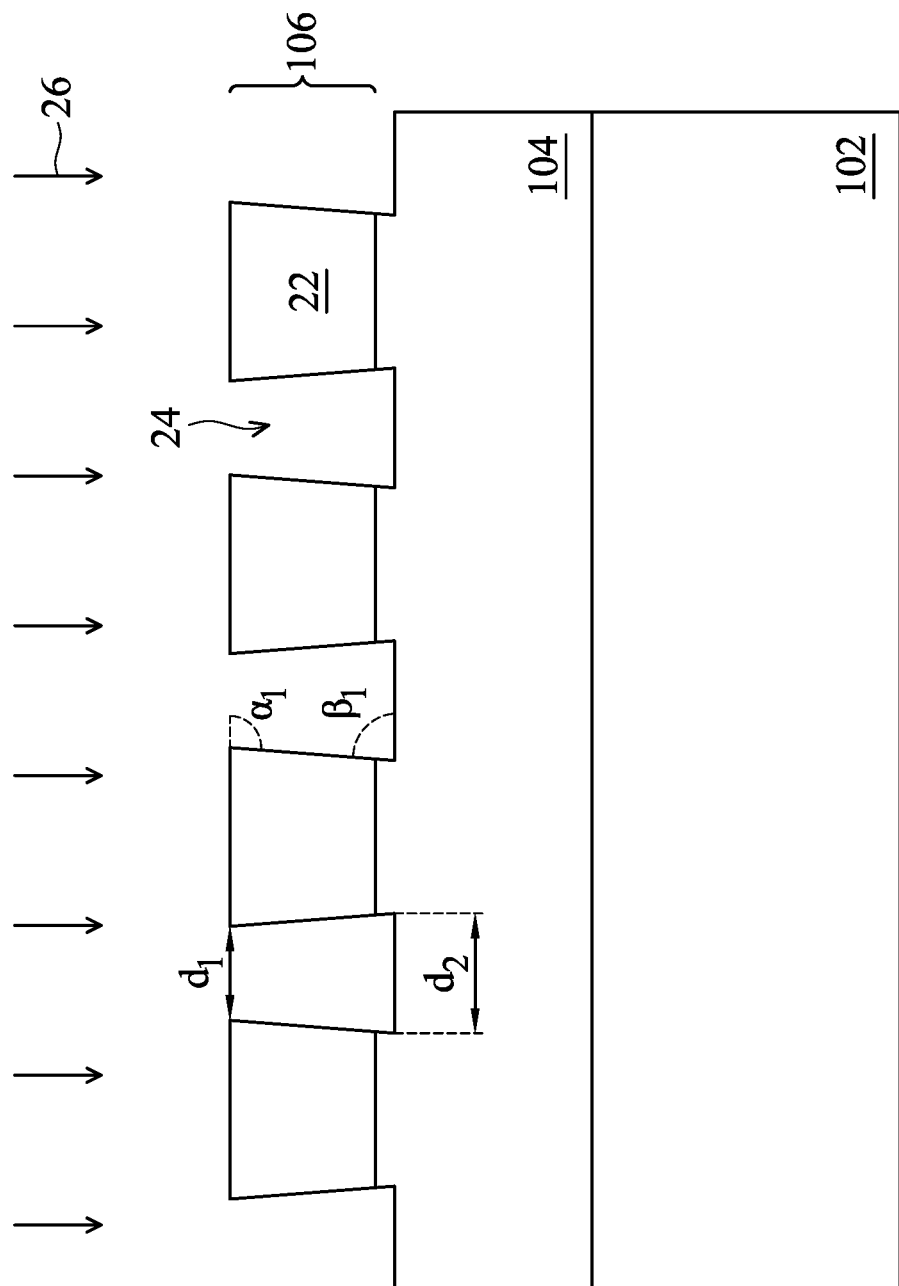

Referring now to FIG. 3, FIG. 3 illustrates the formation of device regions 22 in the top semiconductor layer 106. An etching process 26 is performed using patterned mask 12 (see FIG. 2) as a mask to transfer the pattern of patterned mask 12 to the underlying top semiconductor layer 106. Openings 14 (see FIG. 2) are extended to create trenches 24. The etching may be done by any acceptable etch process, such as a reactive ion etch (RIE), neutral beam etch (NBE), a combination thereof, or the like. The etch process may be anisotropic.

In some embodiments, etching process 26 may include a tuned etch to provide trenches 24 in the top semiconductor layer 106 which are negatively sloped. In such embodiments, for example, the etching may be a dry etch with parameters tuned to achieve negatively sloped trenches 24. For example, selection of process gasses, etch time, chamber pressure, flow rate of process gasses, temperature, plasma source power, and bias power may be adjusted as needed to provide an etch result which produces a trench having a larger bottom dimension (e.g., $d_2$, discussed below) than top dimension (e.g., $d_1$, discussed below). In some embodiments, etching process 26 may include an etch time between about 20 sec and about 60 sec, such as about 35 sec, a pressure between about 3 mTorr and about 45 mTorr, such as about 8 mTorr, a flow rate of the process gas between about 20 sccm and about 800 sccm, such as about 60 sccm, a temperature between about 15° C. and about 65° C., such as about 30° C., a source power between about 500 Watts and about 700 Watts, and a bias power (which may be applied to the chuck of the respective etching tool) between about 100 V and about 500 V, such as about 300 V. These include mere example values and ranges. Other values may be used without limitation to achieve a particular desired etch profile. The values will also be based at least in part on the etchant selected. Any suitable etchant may be used which is selective to the material of top semiconductor layer 106. For example, in some embodiments the process gases may include an etchant which is oxygen based, nitrogen based, hydrogen based, fluorine based, or chlorine based, or combinations thereof. For example, such process gases may include one or more of $O_2$, $N_2$, $H_2$, $CF_4$, $NF_3$, $NH_3$, or $Cl_2$. Other suitable etchant gasses may be used. In addition, other process or mix gasses may be used.

In some embodiments, etching process 26 may include multiple etch processes. For example, in some embodiments a dry etch may be performed followed by a wet etch. The dry etch may be a tuned etch, similar to that described above, or may be an anisotropic etch, or another suitable etch. The etchant gasses may be selected from the same list of etchant gases described above. The wet etch may use a chemical including a fluorine-containing species and metal inhibitors, such as a diluted HF etch. The dry etch may produce trenches having sidewalls which are negatively sloped, substantially vertical, or positively sloped. The wet etch may expand the trench to produce sidewalls which are negatively sloped.

In some embodiments, etching process 26 may result in trenches 24 extending into the insulator layer 104. In some embodiments, trenches 24 may not extend into the insulator layer 104. During etching process 26, insulator layer 104 may be used as an etch stop and a subsequent etch may break through insulator layer 104 by removing some material of insulator 104 so that trenches 24 extend into insulator layer 104. In some embodiments, etching process 26 may partially etch insulator 104 in a single dry etch step or in a combined dry etch step followed by a wet etch step, depending on process gasses and etching chemicals selected. In some embodiments, trenches 24 may extend into insulator layer 104 by a distance of about 5 nm to about 60 nm, such as about 30 nm.

Etching process 26 produces trenches 24 having negatively sloped sidewalls. That is, trenches 24 may taper from bottom to top or conversely flare from top to bottom such that the openings of the trenches 24 are narrower at the top of trenches 24 than at the bottom of trenches 24. Where the sidewalls are negatively sloped, the angle $\beta_1$ of the sidewalls of trenches 24 is less than 90° from the bottom horizontal surface of trenches 24. Conversely, the angle $\alpha_1$ of the sidewalls of trenches to a horizontal line across the top of trenches 24 is greater than 90°. For example in some embodiments the angle $\alpha_1$ may be between greater than 90° and 135°, such as about 110° and the angle $\beta_1$ may be between about 65° up to less than 90°, such as about 80°.

Trenches 24 have a dimension $d_1$ at the top of trenches 24 between about 80 nm and 500 nm, such as about 220 nm. In some embodiments the dimension $d_1$ may be greater than 500 nm. The dimension $d_2$ at the bottom of trenches 24 may be such that a ratio of $d_1:d_2$ is between about 0.6 and 0.95, such as about 0.85. Other dimensions may be used. Each trench of trenches 24 may be individually formed and designed according to a desired layout, such that one trench may have different dimensions than another trench. Trenches 24 also have a length aspect, which is illustrated below with respect to FIG. 23. The lengths may vary greatly according to design layout. The dimension $d_1$ corresponds to a top critical dimension (TCD) of isolation structures deposited within trenches 24 and the dimension $d_2$ corresponds to a bottom critical dimension (BCD) of the isolation structures deposited within trenches 24. Because of the negatively sloped sidewalls of trenches 24, the TCD of trenches 24 is less than the BCD of trenches 24, which can provide better isolation in the subsequently formed isolation structures than if the BCD were less than the TCD, such as in typical isolation structures. Alternatively, the TCD of the device may be reduced while maintaining the same or better effective isolation provided by the subsequently formed isolation structures. For example, the BCD of a typical device may be used as the TCD of a device using the negatively sloped sidewalls as discussed herein.

Figure 4:
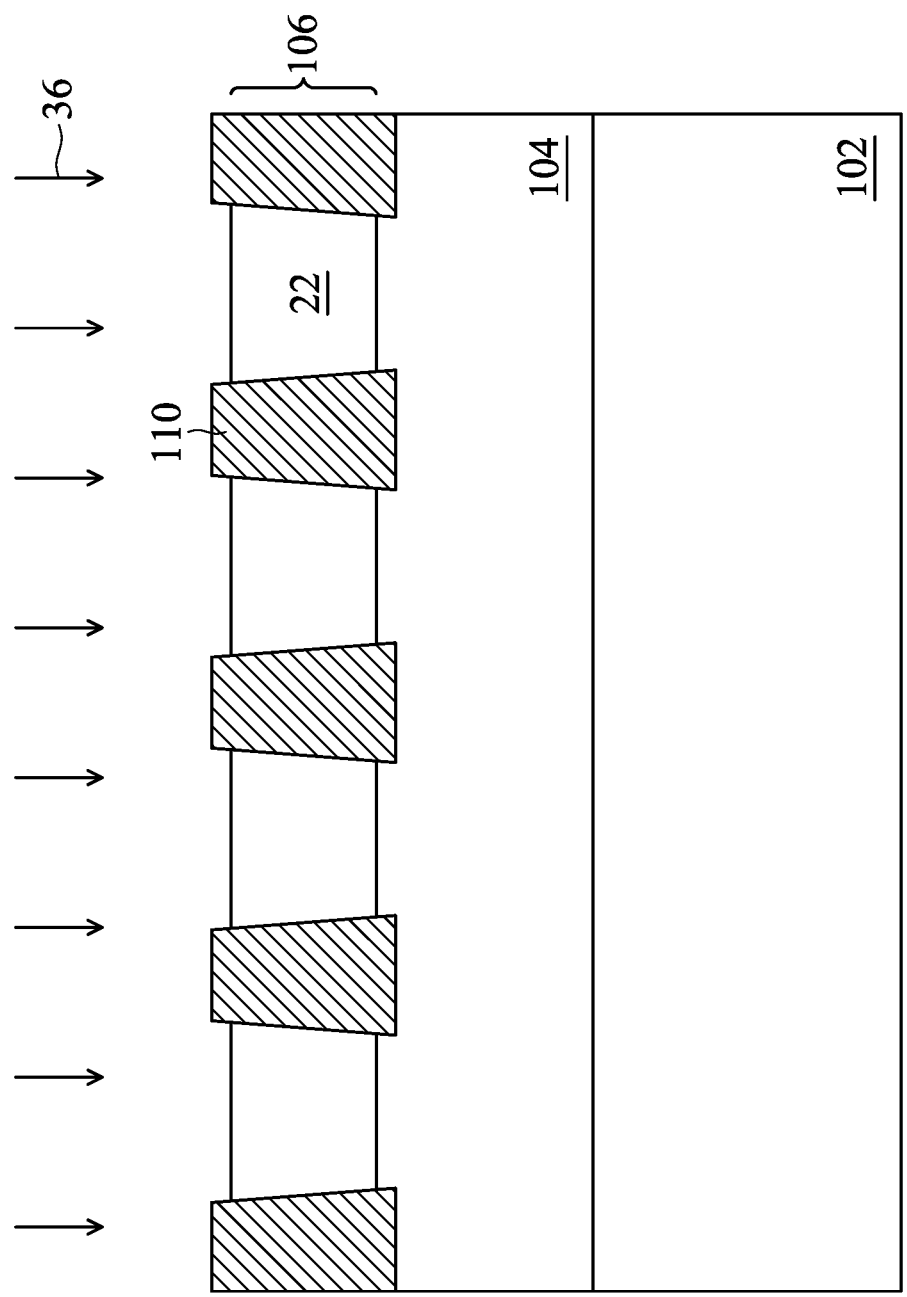

Referring now to FIG. 4, FIG. 4 illustrates the deposition of an insulation material in trenches 24 through a deposition process 36 to form isolation structures 110. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable processes may be also used.

In some embodiments, the isolation structures 110 may include a conformal liner (not illustrated) formed on sidewalls and bottom surfaces of trenches 24 (see FIG. 3) prior to filling trenches 24 with an insulation material of the isolation structures 110. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the device regions 22 of the top semiconductor layer 106 (e.g., Si and/or Ge) into the surrounding isolation structures 110 during the subsequent annealing of the isolation structures 110. In some embodiments, after the insulation material of the isolation structures 110 are deposited, an annealing process may be performed on the insulation material of the isolation structures 110.

In some embodiments, as illustrated in FIG. 4, top surfaces of isolation structures 110 may protrude from the top semiconductor layer 106 such that their top surfaces are higher than the top surfaces of the device regions 22 of top semiconductor layer 106. In some embodiments, a planarization process (see, e.g., FIG. 17), such as a chemical mechanical polishing (CMP), may remove any excess insulation material of the isolation structures 110, such that top surfaces of isolation structures 110 and top surfaces of the device regions 22 of top semiconductor layer 106 are substantially level (or coplanar).

Figure 5:
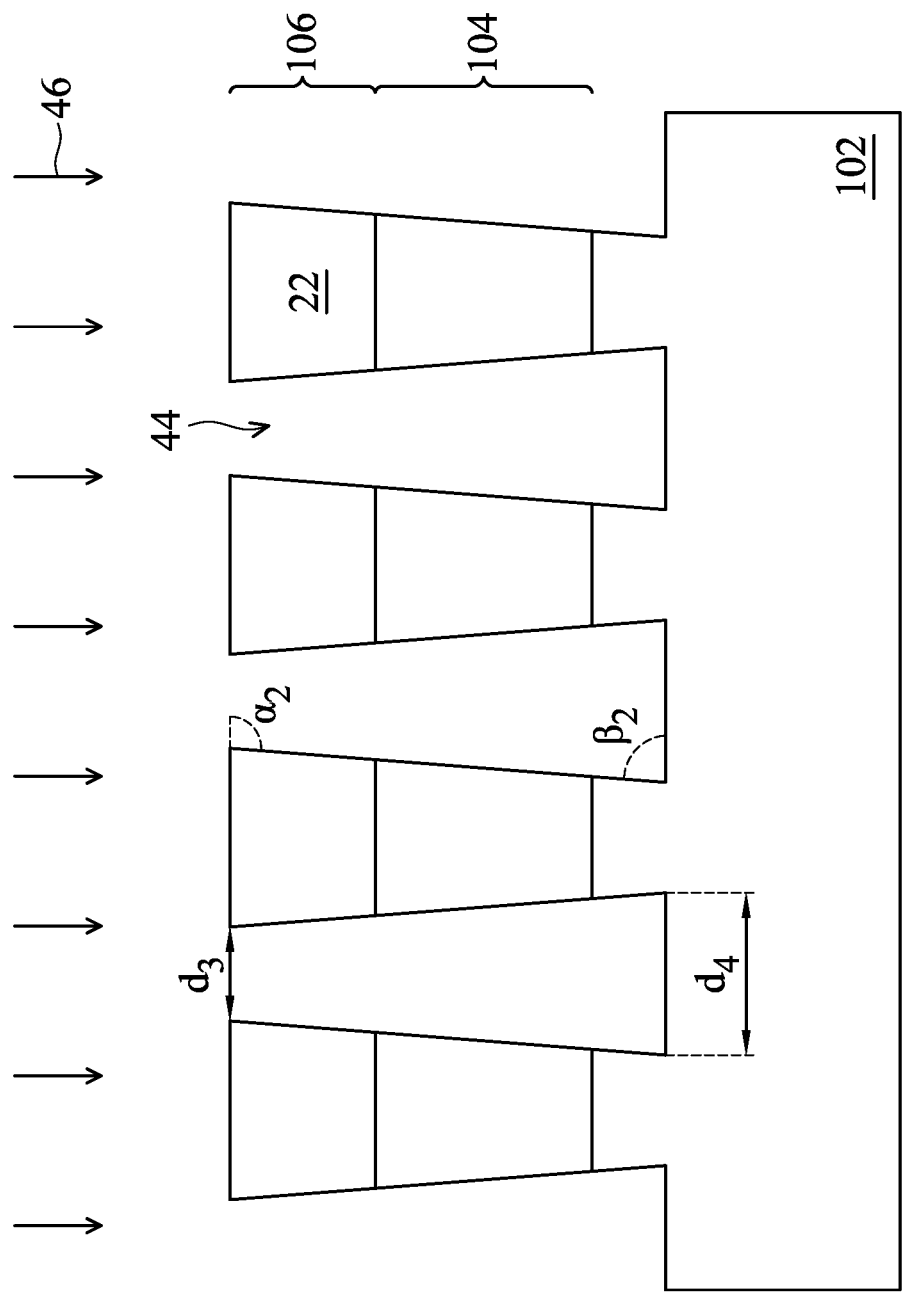
Figure 6:
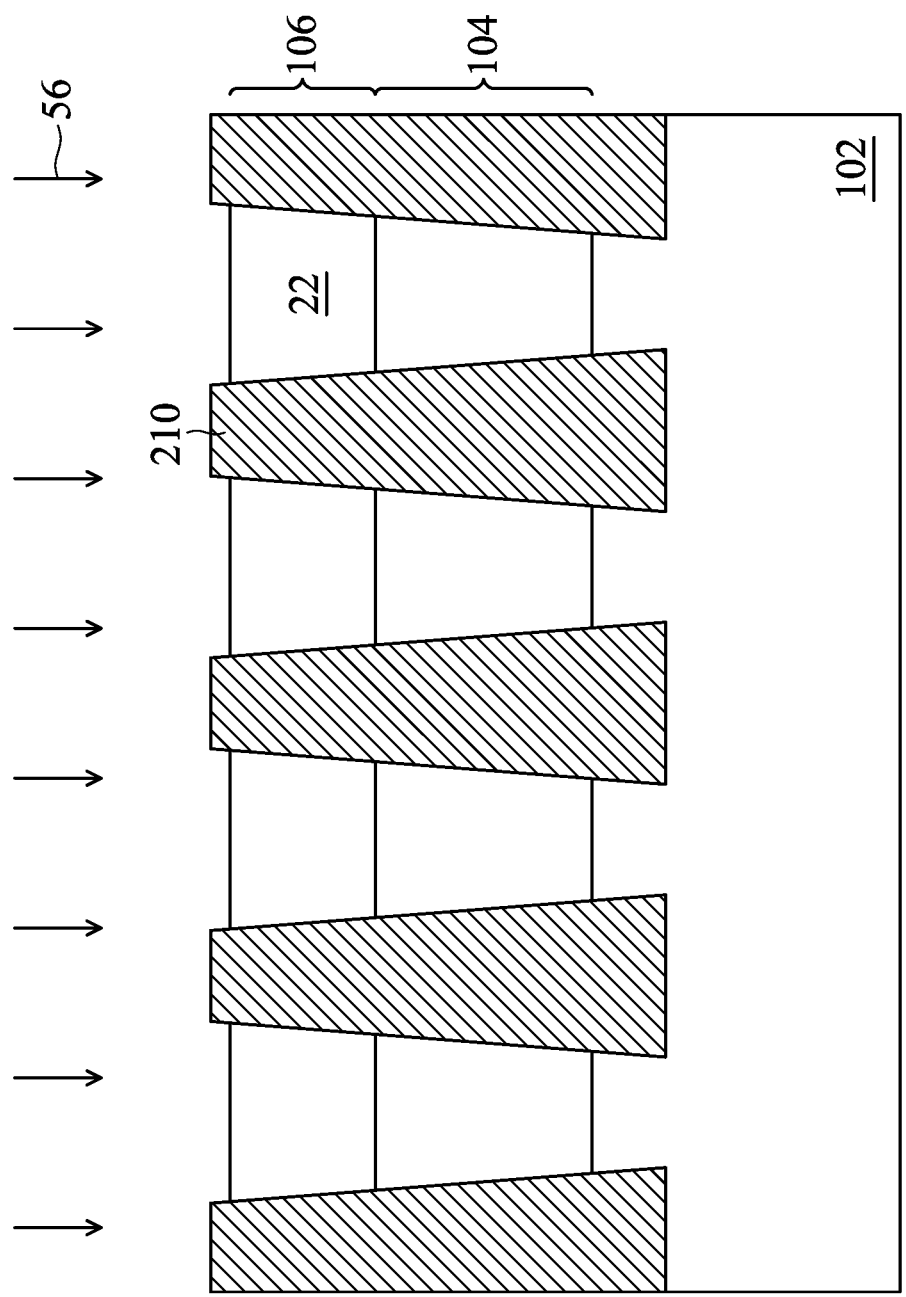
Figure 7:
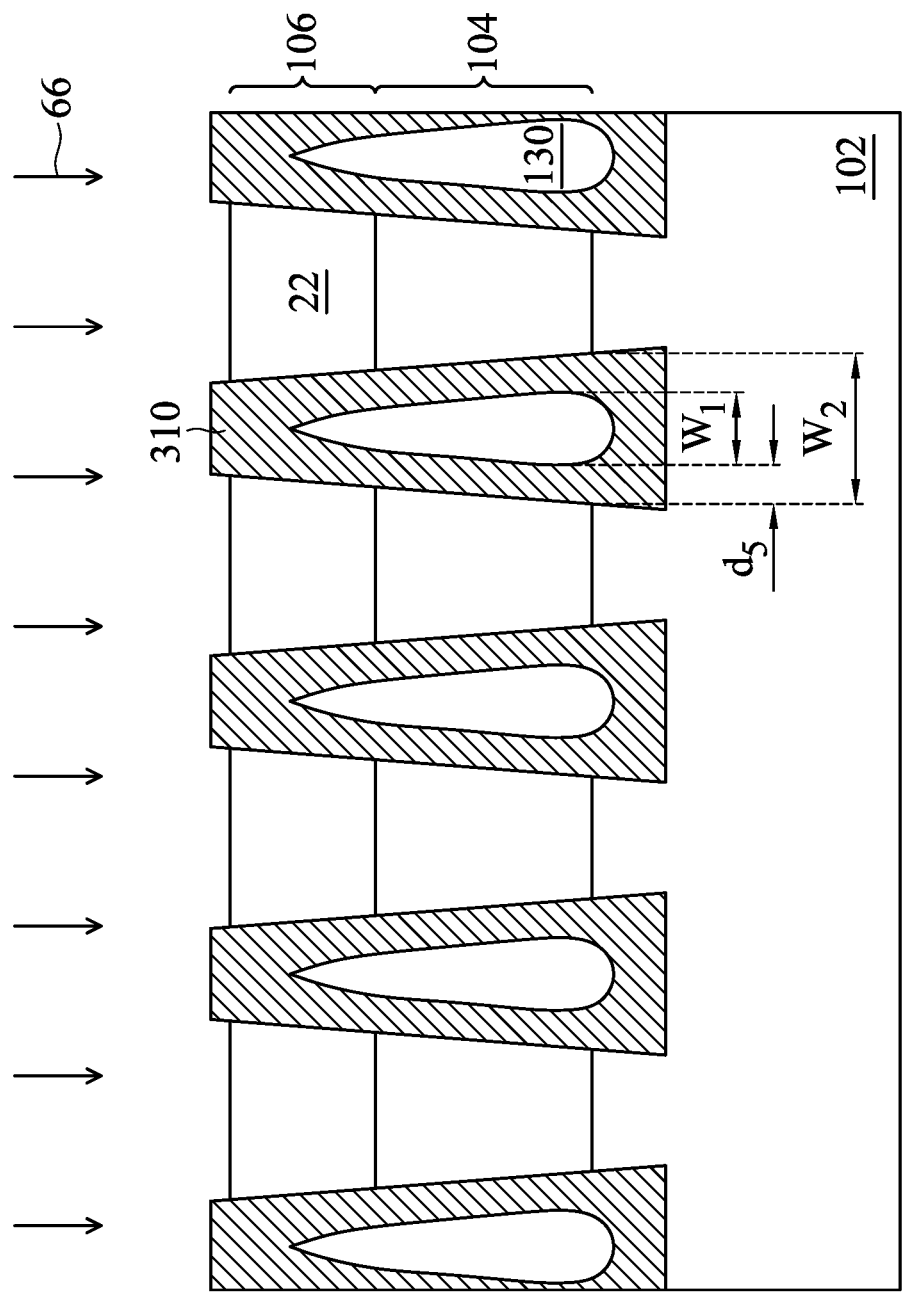

FIGS. 5 through 7 illustrate the formation of deeper trenches and subsequently taller isolation structures. In embodiments consistent with FIGS. 5 and 6, an isolation structure is formed which completely traverses through insulator layer 104. In some embodiments, the isolation structure can penetrate into substrate 102. In embodiments consistent with FIGS. 5 and 7, an isolation structure is formed which is similar to the isolation structure in FIG. 6, but because of the high aspect ratio and differences in TCD and BCD in the trenches, an air gap is formed embedded in the isolation structure, further improving isolation characteristics.

Referring to FIG. 5, FIG. 5 illustrates a process where trenches 24 (see FIG. 3) are further recessed into and through insulator layer 104 and into substrate 102. The trenches 24 are further recessed to form trenches 44 by etching process 46. Etching process 46 may include one or more etch steps to first etch insulator layer 104, using substrate 102 as an etch stop. A subsequent etch may further recess trenches 44 into substrate 102. In some embodiments, trenches 44 may not extend into substrate 102. In some embodiments, a separate etch stop (not shown) may be provided between insulator layer 104 and substrate 102 to assist in controlling etching process 46. Similar to etching process 26, etching process 46 may include a dry etch followed by a wet etch. In some embodiments, etching process 26 and 46 may be combined to perform the dry etch of etching process 26 and etching process 46 followed by the wet etch of etching process 26 and etching process 46. In some embodiments, one of the wet etches of etching process 26 and etching process 46 may be omitted.

Etching process 46 produces trenches 44 having negatively sloped sidewalls. That is, trenches 44 may taper from bottom to top or conversely flare from top to bottom such that the openings of the trenches 44 are narrower at the top of trenches 44 than at the bottom of trenches 44. Where the sidewalls are negatively sloped, the angle $\beta_2$ of the sidewalls of trenches 44 is less than 90° from the bottom horizontal surface of trenches 44. Conversely, the angle $\alpha_2$ of the sidewalls of trenches to a horizontal line across the top of trenches 44 is greater than 90°. For example in some embodiments the angle $\alpha_2$ may be between greater than 90° and 135°, such as about 110° and the angle $\beta_2$ may be between about 60° up to less than 90°, such as about 80°.

Trenches 44 have a dimension $d_3$ at the top of trenches 44 between about 80 nm and 500 nm, such as about 220 nm. In some embodiments the dimension $d_3$ may be greater than 500 nm. The dimension $d_4$ at the bottom of trenches 44 may be such that a ratio of $d_3:d_4$ is between about 0.6 and 0.95, such as about 0.85. Other dimensions may be used. Each trench of trenches 44 may be individually formed and designed according to a desired layout, such that one trench may have different dimensions than another trench. Trenches 44 also have a length aspect, which is shown below with respect to FIG. 23. The dimension $d_3$ corresponds to a TCD of isolation structures deposited within trenches 44 and the dimension $d_4$ corresponds to a BCD of the isolation structures deposited within trenches 44. Because of the negatively sloped sidewalls of trenches 44, the TCD of trenches 44 is less than the BCD of trenches 44.

Referring now to FIG. 6, FIG. 6 illustrates the deposition of an insulation material in trenches 44 (see FIG. 5) through a deposition process 56 to form isolation structures 210. Materials and processes used to deposit the insulation material of isolation structures 210 may be similar to those discussed above with respect to isolation structures 110 and are not repeated.

Referring back to FIGS. 3 and 5, the depth of trenches 24 or trenches 44 may be between about 50 nm and about 500 nm, such as about 100 nm for trenches 24 or 300 nm for trenches 44, as measured from the top of the opening of the trench to the bottom of the trench. In some embodiments, an aspect ratio of the depth of trenches 24 or trenches 44 to the TCD of trenches 24 or TCD of trenches 44 may be between about 0.5 and 10, such as about 2.

Referring now to FIG. 7, FIG. 7 illustrates the deposition of an insulation material in trenches 44 (see FIG. 5) through a deposition process 66 to form isolation structures 310. When the aspect ratio of the depth of trenches 44 (see FIG. 5) to the TCD of trenches 44 is greater than about 4 and less than or equal to about 10, an air gap 130 may be formed within isolation structures 310. Air gap 130 provides further isolation strength and further reduced device close-talk between devices formed in adjacent or nearby device regions 22.

Air gap 130 may have a shape which flares in manner similar to the sidewalls of isolation structure 310, having a narrower top and a wider bottom. Air gap 130 will form depending on deposition process 66 of the insulation material of isolation structures 310. For example, in some embodiments deposition of insulation material may conformally (within process variations) form on the bottom and sidewalls of trenches 44 until the top of air gap 130 is pinched off from further formation within the space of air gap 130. The resulting shape of air gap 130 may have a curved or flat bottom and come to a point at a top extent of air gap 130. Air gap 130 may be embedded in isolation structure 310 such that its sidewalls are substantially equidistant from the interface between isolation structure 310 and device region 22 and between isolation structure 310 and the underlying insulator layer 104 of device region 22.

Air gap 130 may have a height between about 30% to about 80% of the trench 44 height, such as about 50% of the height of trenches 44. Air gap 130 may have a largest width $W_1$ (toward the bottom of the air gap) between about 20% and 80% of the BCD of trenches 44. At the point where air gap 130 is widest, the minimum distance $d_5$ from air gap 130 to the sidewall of isolation structure 310 may be between about 10% and about 40% of the trench CD (or width) $W_2$ at that location. This may also be understood as the thickness of the insulation material of isolation structure 310 wall.

As illustrated in FIG. 7, in some embodiments, air gap 130 may extend into top semiconductor layer 106 or into substrate 102. In some embodiments, air gap 130 may only be disposed in insulator layer 104 or may only be disposed in substrate 102 or may only be disposed in both insulator layer 104 and substrate 102, but not top semiconductor layer 106.

FIGS. 8 through 16 illustrate cross-sectional views of intermediate steps of the manufacture of a semiconductor device, in accordance with some embodiments. FIGS. 8 through 16 illustrate embodiments where isolation structures having negatively sloped sidewalls are formed as well as isolation structures having non-negatively (e.g., positively) sloped sidewalls.

Figure 8:
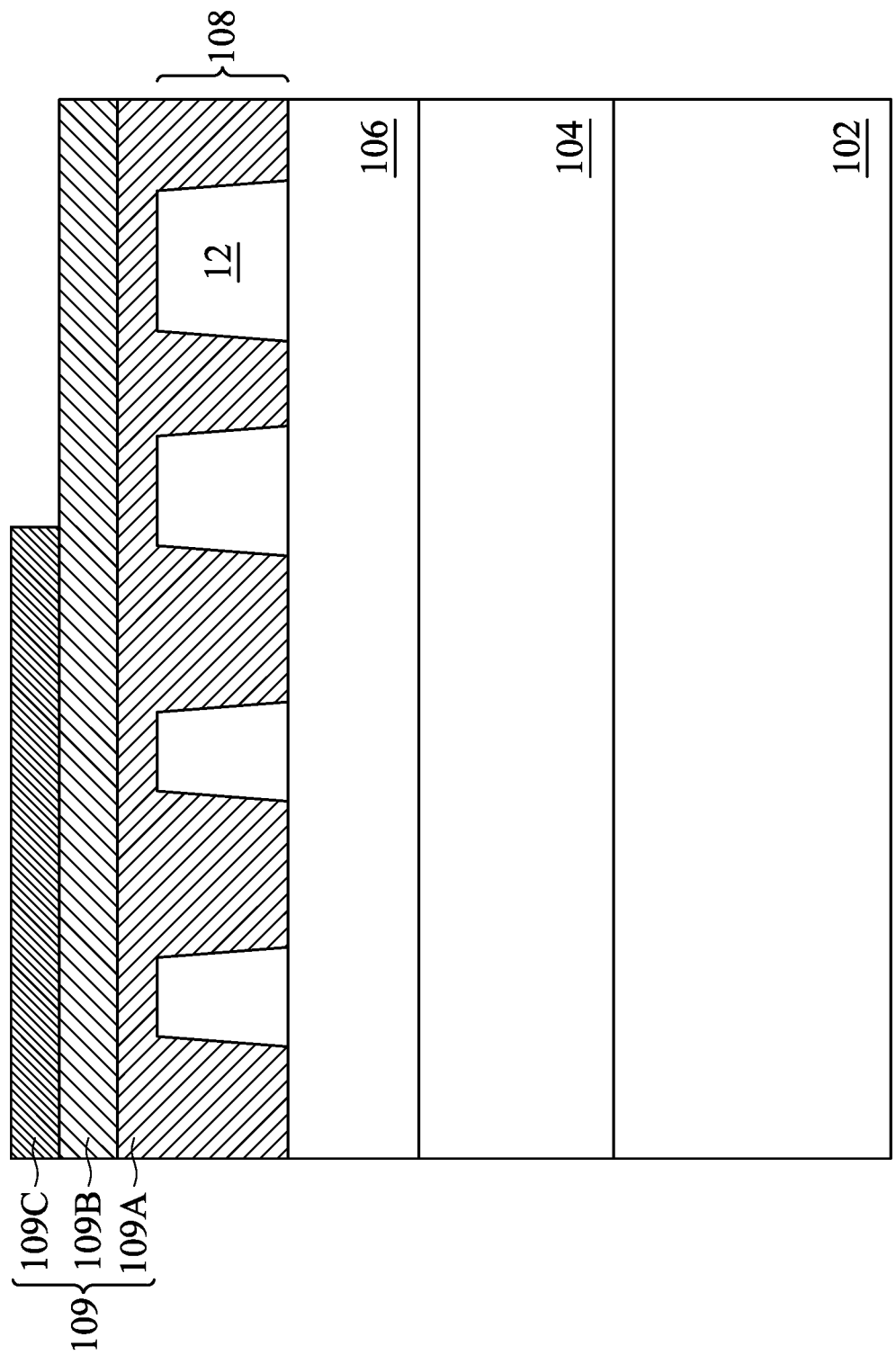
FIGS. 8 through 16 illustrate cross-sectional views of intermediate steps of the manufacture of a semiconductor device, in accordance with some embodiments.

FIG. 8 illustrates the formation of a tri-layer mask 109 over patterned mask 12. Tri-layer mask 109 comprises a bottom layer 109A, a middle layer 109B over the bottom layer 109A, and a top layer 109C over the middle layer 109B. In some embodiments, the bottom layer 109A may comprise an organic material, such as a spin-on carbon (SOC) material, or the like, and may be formed using spin-on coating, CVD, ALD, or the like. The middle layer 109B may comprise an inorganic material, which may be a nitride (such as SiN, TiN, TaN, or the like), an oxynitride (such as SiON), an oxide (such as silicon oxide), or the like, and may be formed using CVD, ALD, or the like. The top layer 109C may comprise an organic material, such as a photoresist material, and may be formed using a spin-on coating, or the like. In some embodiments, the top layer 109C of the tri-layer mask 109 is patterned using suitable photolithography techniques to expose a portion of the middle layer 109B, which is subsequently etched using the top layer 109C as a mask.

Figure 9:
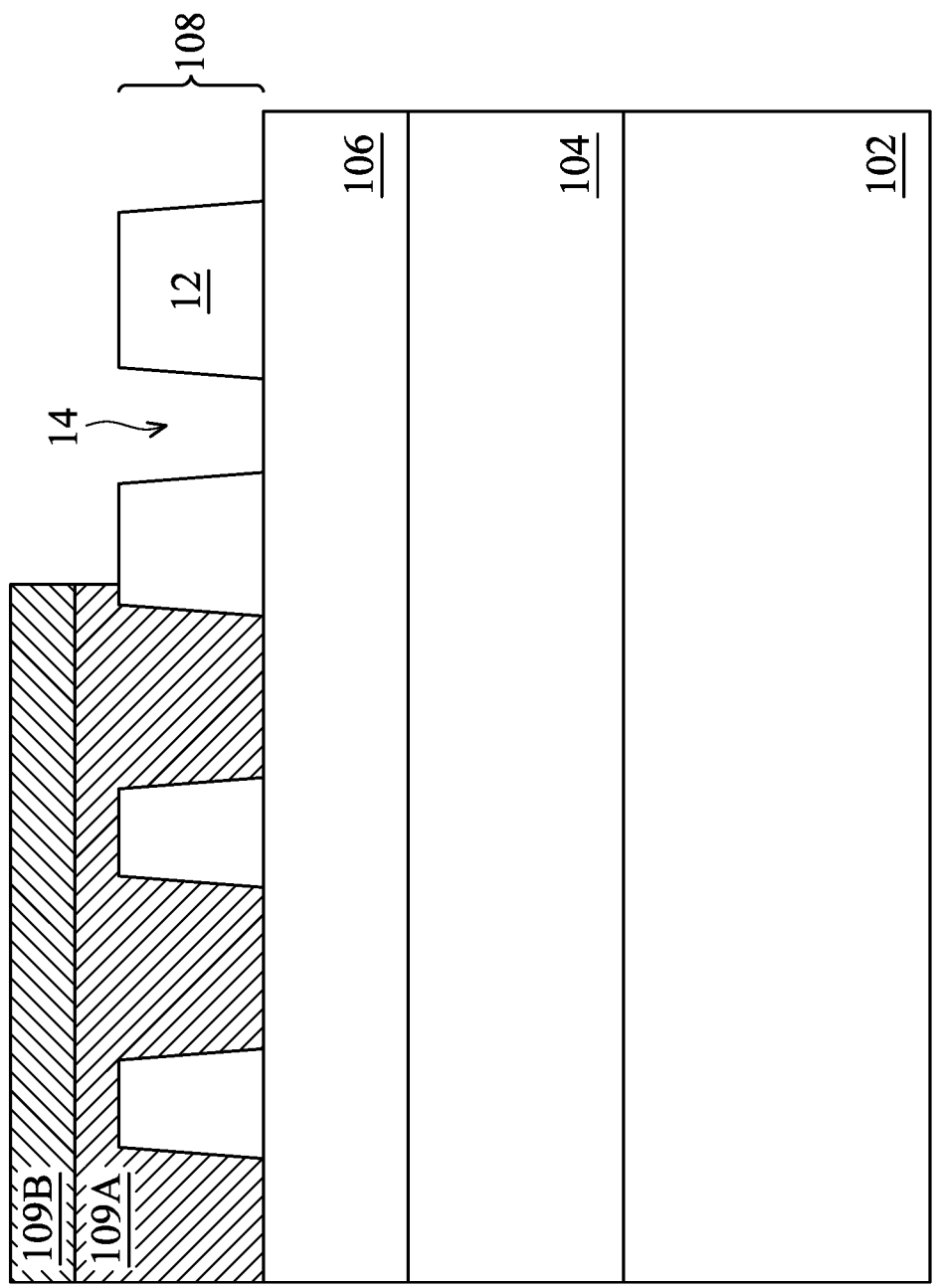

FIG. 9 illustrates the removal of portions of the bottom layer 109A of tri-layer mask 109. Middle layer 109B is used as a mask to protect other portions of bottom layer 109A that should not be removed. In the removal of the portions of the bottom layer 109A, the top layer 109C may be consumed. The removal of the portions of the bottom layer 109A exposes part of the patterned mask 12 and corresponding openings 14 formed therein.

Figure 10:
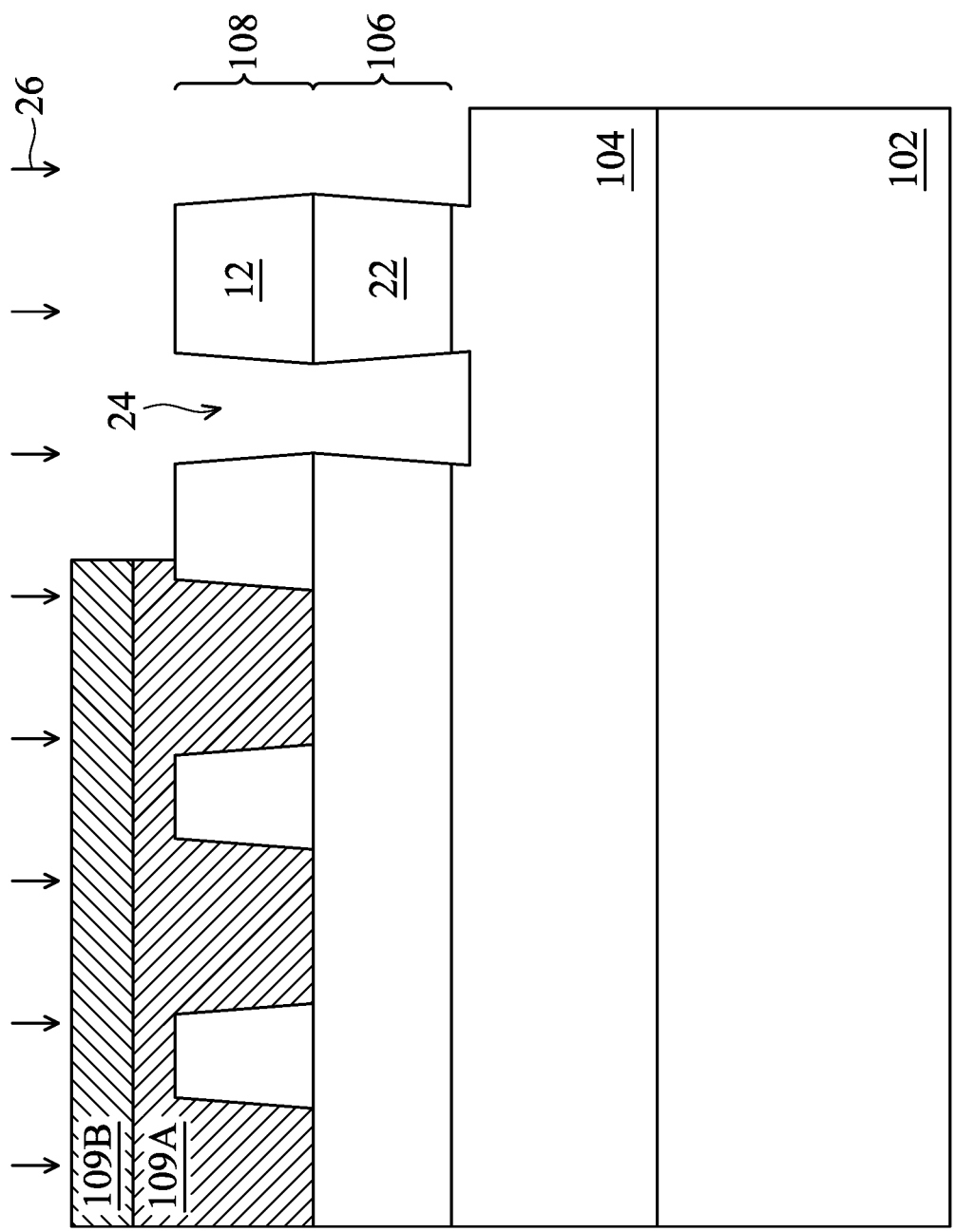

FIG. 10 illustrates the etching of trenches 24 having negatively sloped sidewall by etching process 26, such as described above with respect to FIG. 3, which is not repeated. During etching process 26, the bottom layer 109A protects the portions of top semiconductor layer 106 which are not etched to form trenches.

Figure 11:
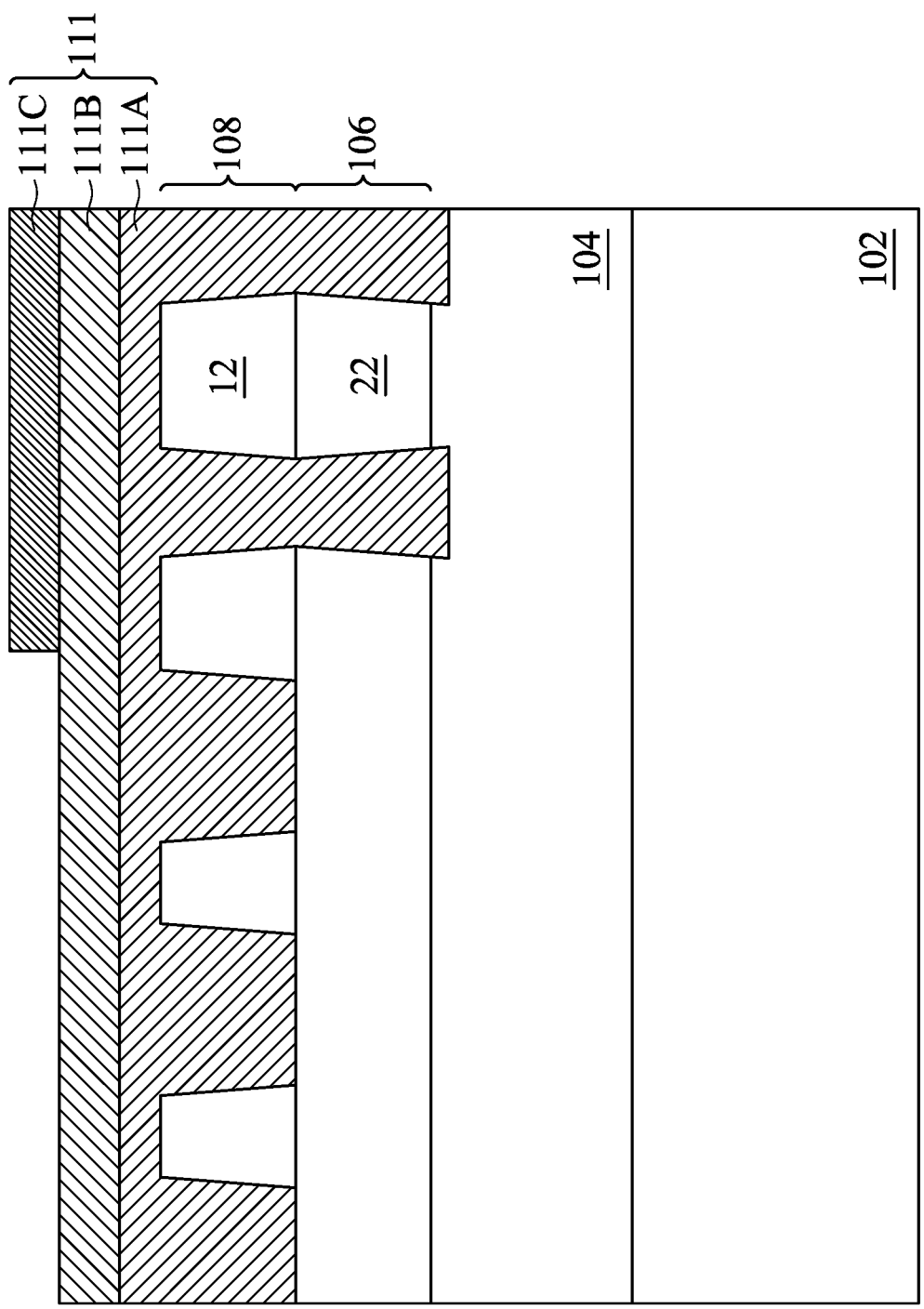

Referring now to FIG. 11, the bottom layer 109A is removed by any suitable technique and another tri-layer mask 111 is formed over patterned mask 12. Tri-layer mask 111 is similar to tri-layer mask 109 and may be formed using the same processes and materials as described above with respect to tri-layer mask 109, which are not repeated. The top layer 111C of tri-layer mask 111 may be patterned to expose portions of the middle layer 111B, which is subsequently etched using the top layer 111C as a mask.

Figure 12:
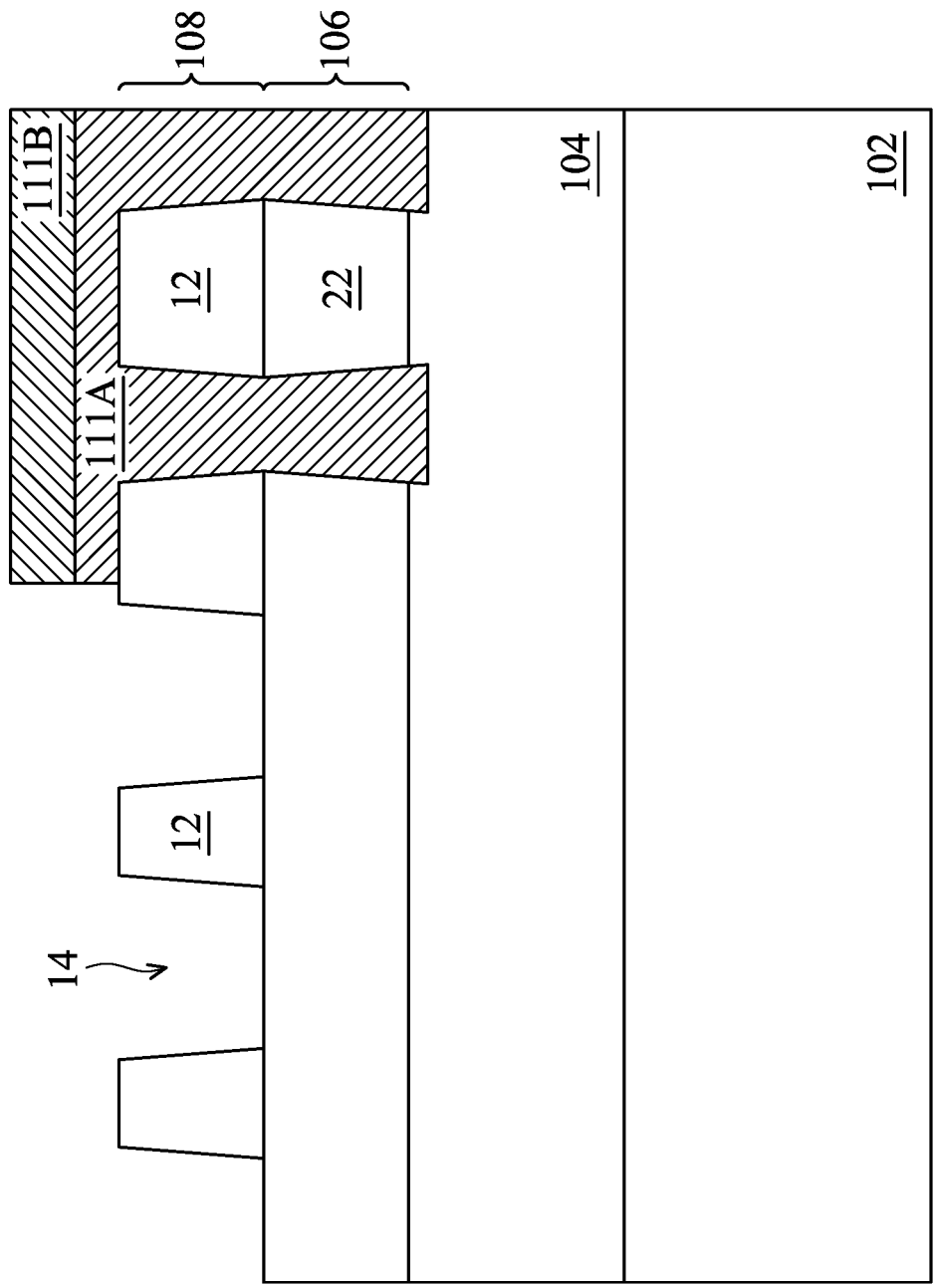

FIG. 12 illustrates the removal of portions of the bottom layer 111A of tri-layer mask 111. Middle layer 111B is used as a mask to protect other portions of bottom layer 111A that should not be removed. In the removal of the portions of the bottom layer 111A, the top layer 111C may be consumed. The removal of the portions of the bottom layer 111A exposes part of the patterned mask 12 and corresponding openings 14 formed therein.

Figure 13:
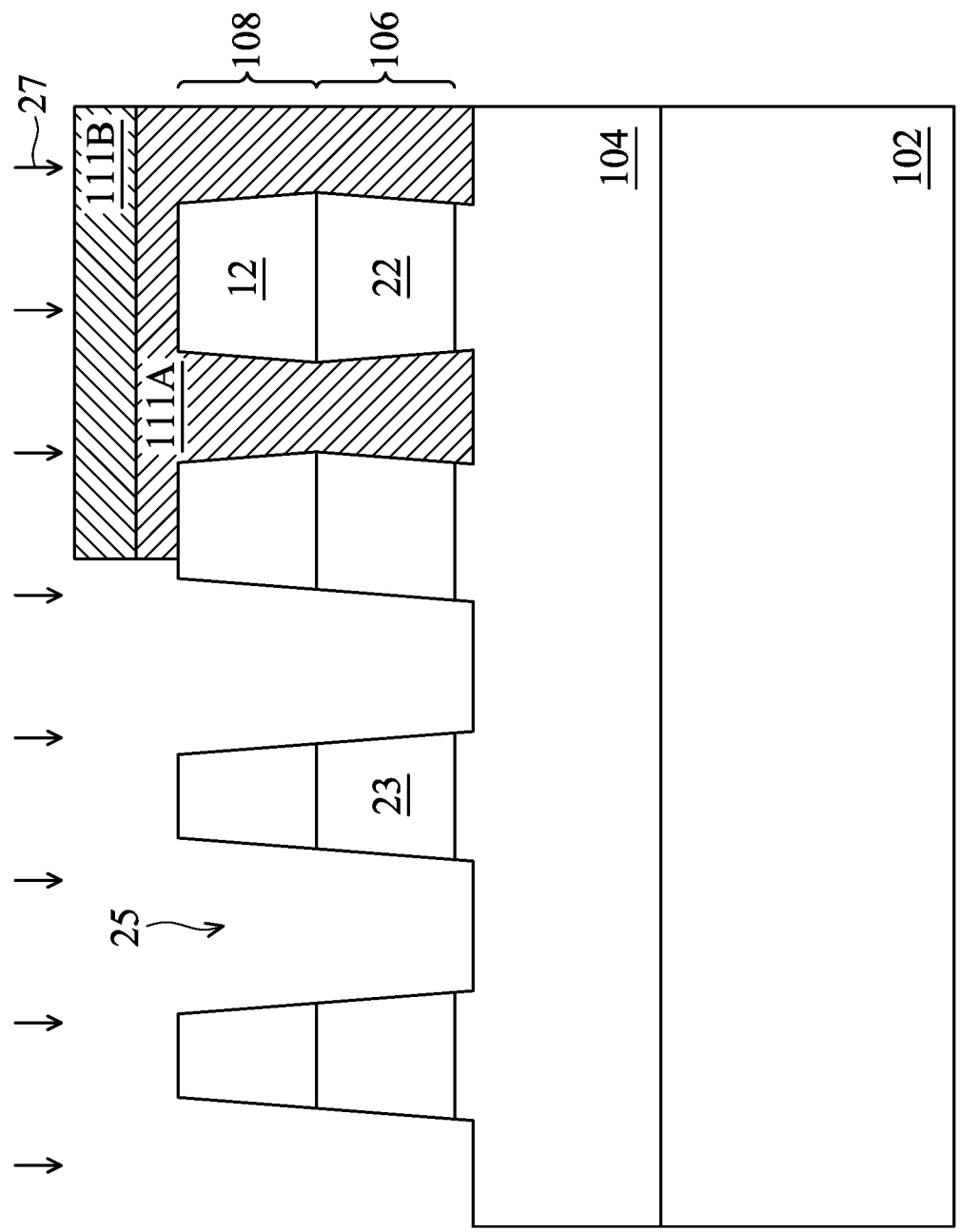

Referring now to FIG. 13, FIG. 13 illustrates the etching of trenches 25 having non-negative (e.g., positive) sloped sidewalls by etching process 27. Etching process 27 may include any suitable etching process, such as a dry or wet etch using suitable etchants, which are selective to the material of top semiconductor layer 106. Etching process 27 may include multiple etching steps. For example, a first etch may form trenches 25 to insulator layer 104 and a subsequent etch may break through the insulator layer 104 to extend trenches 25 into insulator layer 104. Trenches 25 may extend into insulator layer 104 by a depth of 5 nm to about 60 nm, such as about 30 nm. In some embodiments, trenches 25 may not extend into insulator layer 104. Isolation structures having non-negative (e.g., positive) sloped sidewalls will be formed in trenches 25 on either side of device region 23.

Figure 14:
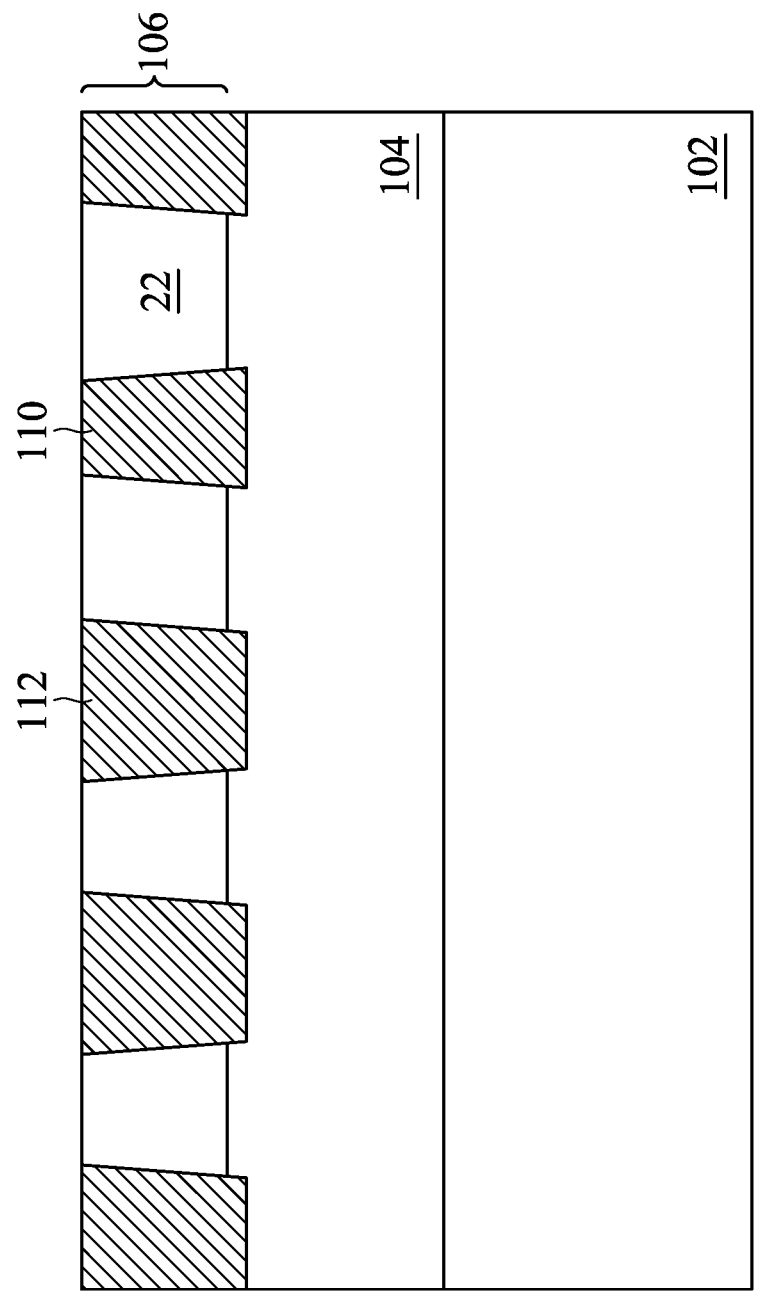

Referring now to FIG. 14, FIG. 14 illustrates the formation of isolation structures 110 and isolation structures 112. Tri-layer mask 111 is removed using any suitable process. Subsequently, insulation material may be deposited in trenches 24 and trenches 25 (see FIGS. 10 and 13) through a deposition process to form isolation structures 110 and isolation structures 112. Materials and processes used to deposit the insulation material of isolation structures 110 and isolation structures 112 may be similar to those discussed above with respect to isolation structures 110 of FIG. 4 and are not repeated. The resulting isolation structures 110 have negatively sloped sidewalls, while the resulting isolation structures 112 have non-negatively sloped sidewalls (e.g., positively sloped sidewalls). In this way, different types of isolation structures may be formed for different devices on one wafer.

Figure 15:
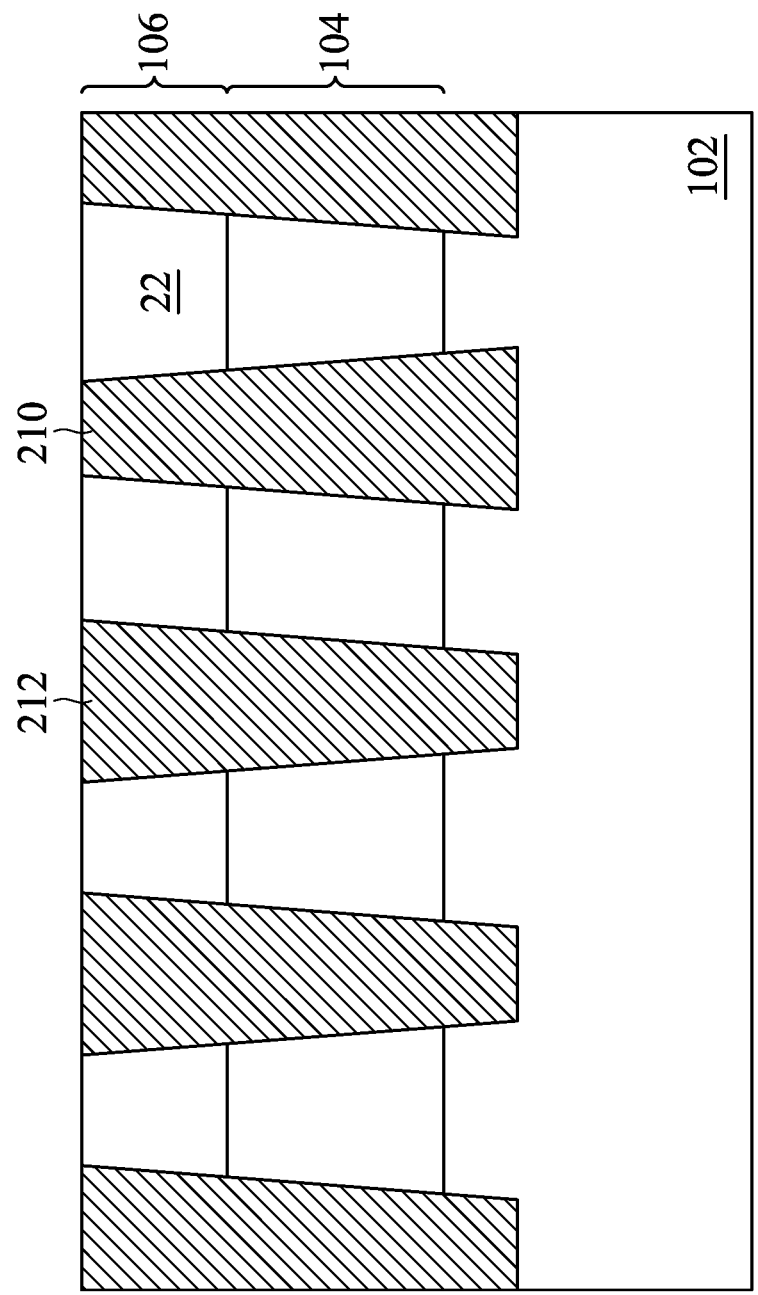
Figure 16:
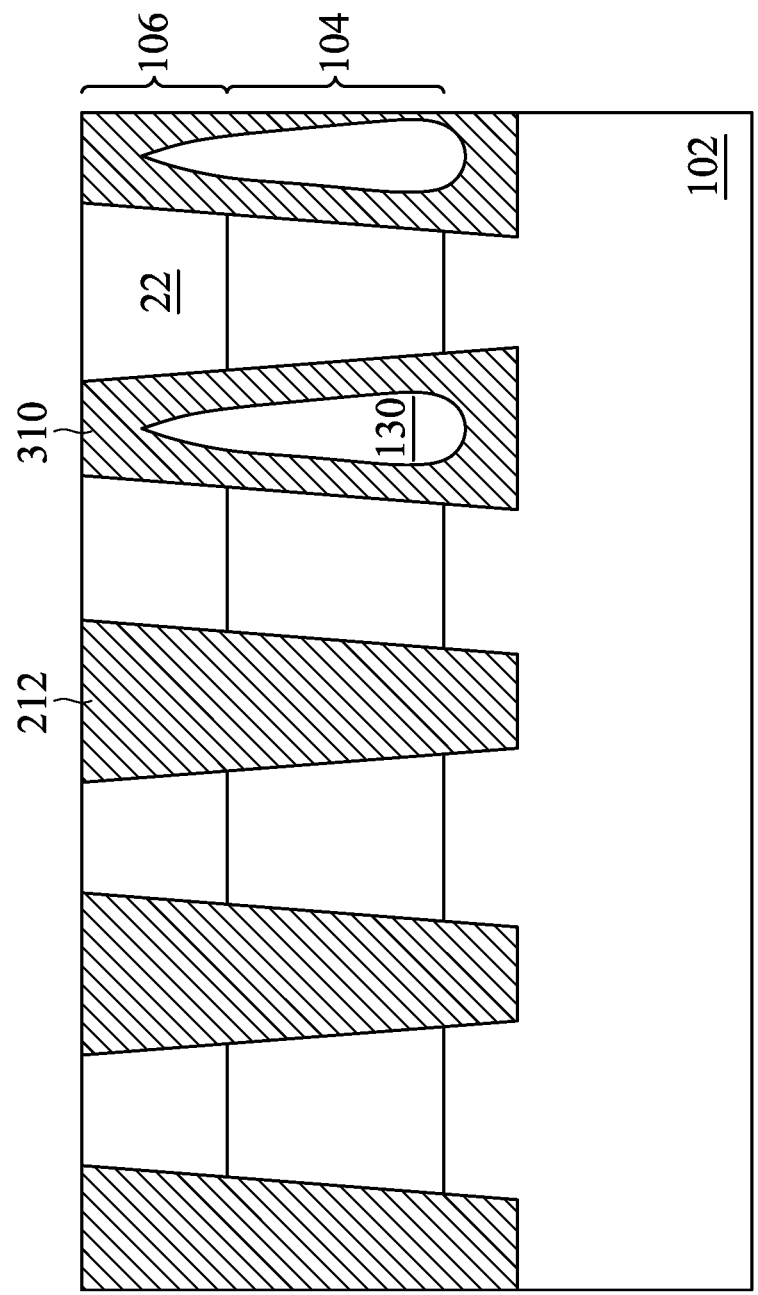

FIGS. 15 and 16 illustrate counterparts to the formation of isolation structures 110 of FIG. 14. FIG. 15 illustrates a counterpart of FIG. 14 where isolation structure 210 of FIG. 6 is formed by modifying the process in FIGS. 8-14 to further recess the trenches such as illustrated in FIG. 5. FIG. 16 illustrates a counterpart of FIG. 14 where isolation structure 310 of FIG. 7 is formed by modifying the process in FIGS. 8-14 to further recess the trenches such as illustrated in FIG. 5 and forming an isolation structure having an air gap embedded therein. These embodiments are described in more detail below.

FIG. 15 illustrates isolation structures 210 and isolation structures 212, in accordance with some embodiments. Isolation structures 210 are negatively sloped isolation structures such as discussed above with respect to isolation structures 210 of FIG. 6. Isolation structures 212 are non-negatively sloped isolation structures which may be formed by combining the techniques discussed above with respect to FIGS. 8-14 and the techniques discussed with respect to FIG. 6 to further recess the trenches 44 through insulator layer 104. Similarly, etch process 27 (see FIG. 13) may be modified to also further recess the trenches 25 of FIG. 13 through insulator layer 104. In some embodiments, the trenches may be further recessed to also break through substrate 102.

The isolation structures 210 and 212 are formed in the resulting trenches by the deposition of insulation material through a deposition process using materials and processes similar to those discussed above with respect to FIG. 4 and are not repeated.

FIG. 16 illustrates isolation structures 310 and isolation structures 212, in accordance with some embodiments. Isolation structures 310 are negatively sloped isolation structures such as discussed above with respect to isolation structures 310 of FIG. 7. Isolation structures 310 have air gaps 130 formed therein. Isolation structures 212 are non-negatively sloped isolation structures which may be formed in a manner similar to that discussed above with respect to FIG. 15. Because the TCD of isolation structures 212 is greater than the BCD of isolation structures 212, an air gap will not form in the trench corresponding to isolation structure 212. However, because the TCD of isolation structures 310 is smaller than the BCD of isolation structures 310, an air gap 130 may be formed therein, such as discussed above with respect to FIG. 7.

Although the process described in FIGS. 8-16 are described in a particular order, one of skill will understand that the steps may have been performed in another order. For example, referring to FIG. 14, trenches for isolation structure 112 may be formed prior to trenches for isolation structure 110. Also, in some embodiments, isolation structure 112 and isolation structure 110 may be completely formed independently, leaving a respective bottom layer 109A or 111A in place while the isolation structure 110 or 112 is completely formed. Other orders may be used as appropriate.

In some embodiments, the techniques described above with respect to FIGS. 1-16 may be mixed to achieve different isolation structures of different depths and different sidewall slopes.

Figure 17:
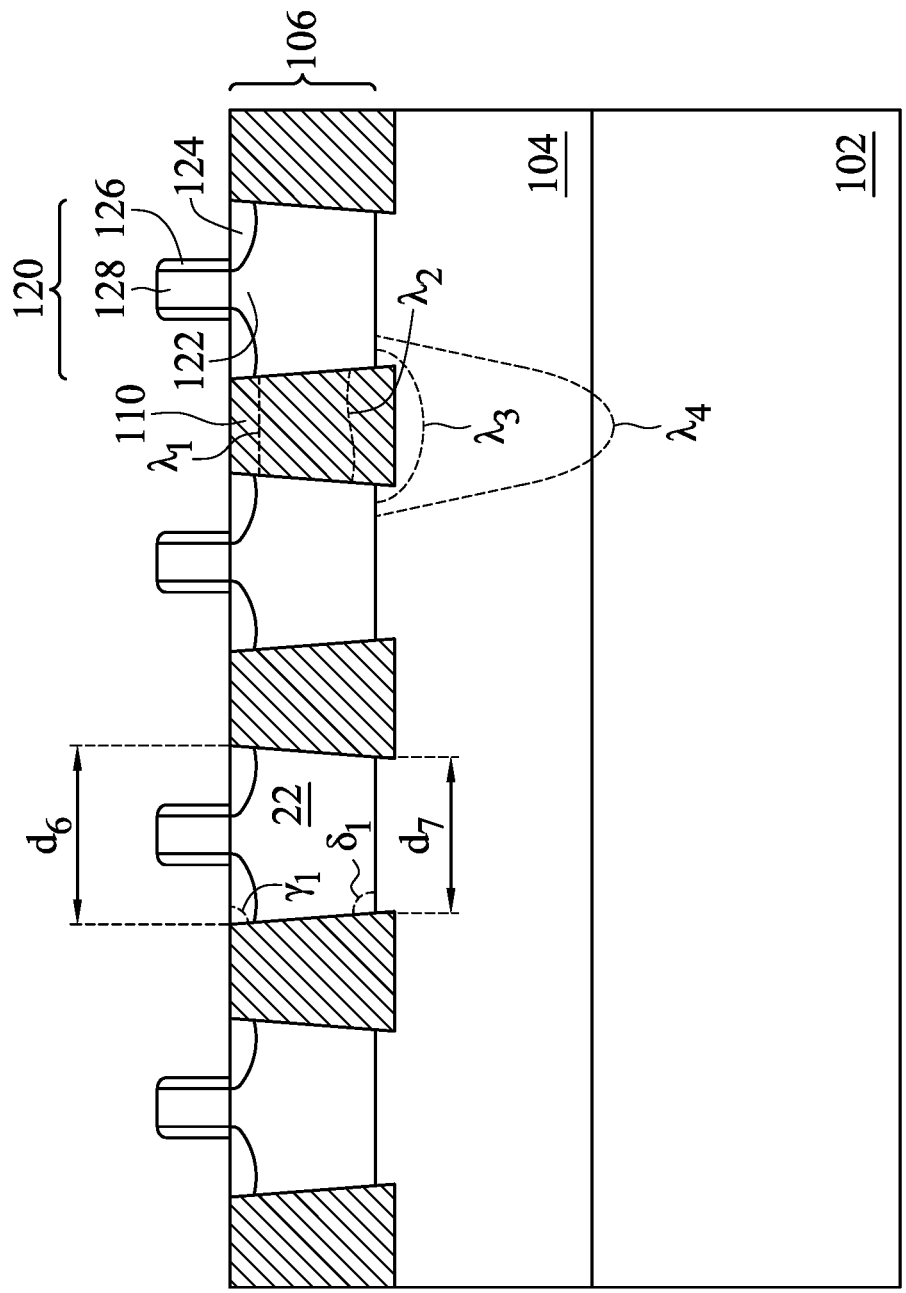
FIGS. 17 through 18 illustrate a device in an intermediate stage of formation, in accordance with some embodiments.
Figure 18:
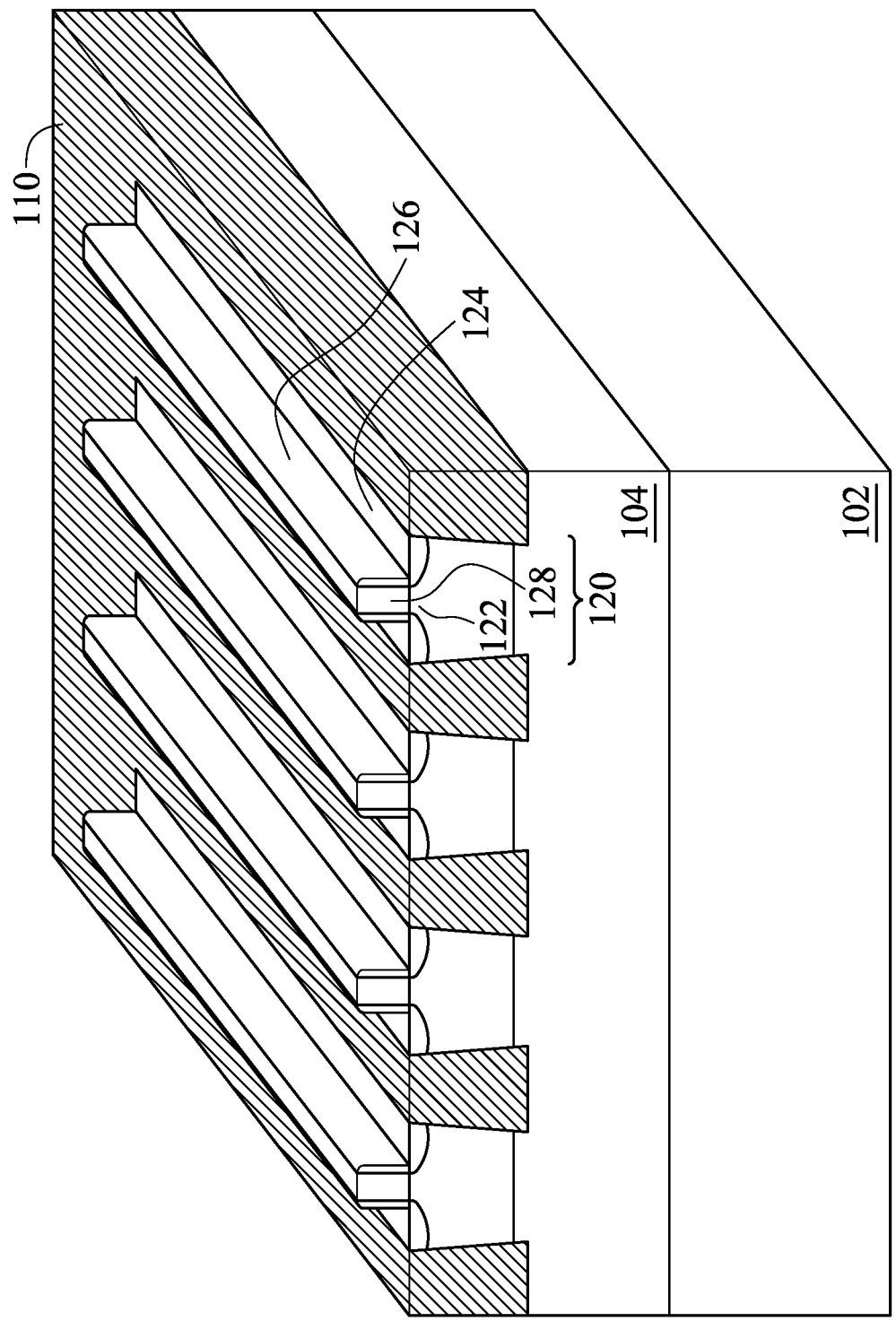

FIGS. 17 through 18 illustrate a device in an intermediate stage of formation, in accordance with some embodiments. The isolation structures 110 of FIG. 17 may be formed according to the processes discussed above with respect to FIGS. 1-5.

Resulting device regions 22 between adjacent isolation structures 110 may be tapered inverse to the shape of the isolation structures 110. A top angle $\gamma_1$ of device region 22, measured from a top surface of device region 22 to a side wall of device region 22, may be less than 90°, such as between about 65° and 90°. A bottom angle 61 of device region 22, measured from a bottom surface of device region 22 to a side wall of device region 22 may be greater than 90°, such as between about 90° and 135° Other angles may be used. A width $d_6$ of device region 22 at a TCD of device region 22 may be between about 100 nm and 400 nm. A width $d_7$ of device region at a BCD of device region 22 may be between about 65 nm and 300 nm. Other dimensions greater or less than these may be used. The TCD of device region 22 is greater than the BCD of device region 22. The ratio of TCD to BCD of device region 22 may be between about 1.05 and 1.5.

Following the formation of isolation structures 110, devices may be formed in device region 22 (see FIG. 5). For example, a transistor 120 may be formed to create a channel region 122 in device region 22. Source/drain regions 124 and a gate structure including a gate electrode 128 and gate spacer 126 may be formed using suitable techniques.

In some embodiments, a dummy gate may be formed and later replaced with a replacement gate. For example, a dummy gate may be formed by depositing a dummy gate dielectric layer and dummy gate electrode layer. The gate dielectric layer and dummy gate electrode layer may be patterned to form a dummy gate structure. A spacer layer may be deposited over the dummy gate structure and anisotropically etched to leave vertical portions of the spacer layer, resulting in gate spacers 126.

Source/drain regions 124 may be formed by using the dummy gate to define implantation regions, where p-type or n-type dopants may be implanted, depending on the type of device. In some embodiments, recesses may be etched next to the dummy gate and doped or undoped source/drain regions 124 epitaxially grown therein.

In embodiments using a dummy gate, a replacement gate process may be performed to replace the dummy gate with a permanent gate, such as a metal gate. An etch stop layer (not shown) and an interlayer dielectric (ILD) (not shown) are deposited over the dummy gates, and over the source/drain regions 124. In some embodiments, the ILD may be a flowable film formed by a flowable CVD. In some embodiments, the ILD may be formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable deposition method, such as CVD, PECVD, a combination thereof, or the like. In some embodiments, the etch stop layer is used as a stop layer while patterning the ILD to form openings for subsequently formed contacts. Accordingly, a material for the etch stop layer may be chosen such that the material of the etch stop layer has a lower etch rate than the material of ILD.

A planarization process, such as a CMP, may be performed to level the top surface of ILD with the top surfaces of the dummy gates, exposing the dummy gates. Recesses are made in the dummy gates, removing the dummy gate electrode and optionally the dummy gate dielectric, exposing an underlying channel region.

Gate dielectric layers (see gate dielectric 129 of FIG. 24), and gate electrodes 128 are formed in the recesses made in the dummy gates. In some embodiments, the gate dielectric layers comprise silicon oxide, silicon nitride, or multilayers thereof. In other embodiments, the gate dielectric layers include a high-k dielectric material, and in these embodiments, the gate dielectric layers may have a k value greater than about 7.0, and may include a metal oxide or a silicate of Hf, Al, Zr, La, Mg, Ba, Ti, Pb, and combinations thereof. The formation methods of the gate dielectric layers may include Molecular-Beam Deposition (MBD), ALD, CVD, PECVD, a combination thereof, or the like. In some embodiments, the formation may result in a conformally deposited layer with horizontal portions and vertical (or non-horizontal) portions having substantially the same thickness, for example, with the vertical thickness of the vertical portions of the gate dielectric layers and the horizontal thickness of the horizontal portions of the gate dielectric layers having a difference smaller than 20 percent. In some embodiments, the gate dielectric layers may be thermally grown.

Next, the gate electrodes 128 are deposited over the gate dielectric layers and fill the remaining portions of the recesses of the dummy gates. The gate electrodes 128 may be made of a metal-containing material such as TiN, TaN, TaC, TiC, TiO, Co, Ru, Al, Ag, Au, W, Ni, Ti, Cu, combinations thereof, or multi-layers thereof. After the filling of the gate electrodes, a planarization process, such as a CMP, may be performed to remove the excess portions of the gate dielectric layers, and the gate electrodes 128, which excess portions are over the top surface of the ILD. The gate electrodes 128 may include a series of one or more stacked layers (not shown). The stacked layers may include a diffusion barrier layer and one or more work function layers over the diffusion barrier layer. The diffusion barrier layer may be formed of titanium nitride (TiN) or thallium nitride. The work function layer(s) determine the work function of the gate, and may include at least one layer, or a plurality of layers formed of different materials. The specific material of the work function layer may be selected according to the type of transistor 120 being formed. For example, when the transistor 120 is an n-type, the work function layer may include an AlTiC layer. When the transistor 120 is a p-type, the work function layer may include an AlTiN and/or AlTiC layer. After the deposition of the work function layer(s), a barrier layer (not shown), which may be another TiN layer, may be formed.

Referring again to FIG. 17, $\lambda_1$, $\lambda_2$, $\lambda_3$, and $\lambda_4$ each represent close-talk or cross-talk effects. $\lambda_1$, for example, may include a capacitance coupling through the isolation structure 110 at a TCD of the isolation structure 110. $\lambda_2$ may include a capacitance coupling through the isolation structure 110 at a BCD of the isolation structure 110. Whereas in an isolation structure with positively sloped sidewalls the capacitance coupling in $\lambda_2$ would be greater than the capacitance coupling in $\lambda_1$, because the TCD of the negatively sloped isolation structure 110 is smaller than the BCD of the isolation structure, the capacitance coupling in $\lambda_2$ is lower than in $\lambda_1$. Thus, noise added by increased capacitance coupling in a typical isolation structure may be avoided by using a negatively sloped isolation structure 110. Similarly, $\lambda_3$ and $\lambda_4$ may include a capacitance coupling through insulator layer 104 and through substrate 102, respectively.

Each of $\lambda_1$, $\lambda_2$, $\lambda_3$, and $\lambda_4$ may also include a resistive aspect of close-talk or cross-talk effects where lower resistance results in a greater leakage effect from one device to another device. Whereas in an isolation structure with positively sloped sidewalls the resistive leakage in $\lambda_2$ would be greater than the resistive leakage in $\lambda_1$, because the TCD of the negatively sloped isolation structure 110 is smaller than the BCD of the isolation structure, the resistive leakage in $\lambda_2$ is lower than in $\lambda_1$.

Referring to FIG. 18, a perspective view of the device of FIG. 17 is illustrated, in accordance with some embodiments. Devices such as transistor 120 are formed in a top semiconductor layer 106 and are separated by isolation structures 110 having negatively sloped side walls. Isolation structures 110 may be used in place of positively sloped isolation structures without negatively impacting channel length or other aspects of transistor 120. A more effective isolation structure is therefore achieved. Because the TCD of the isolation structure 110 may be the same as the TCD of a typically used isolation structure, a gain in isolation strength can be achieved in the same critical dimension of the active devices 120. Isolation strength increases as depth into the isolation structure 110 increases.

Figure 19:
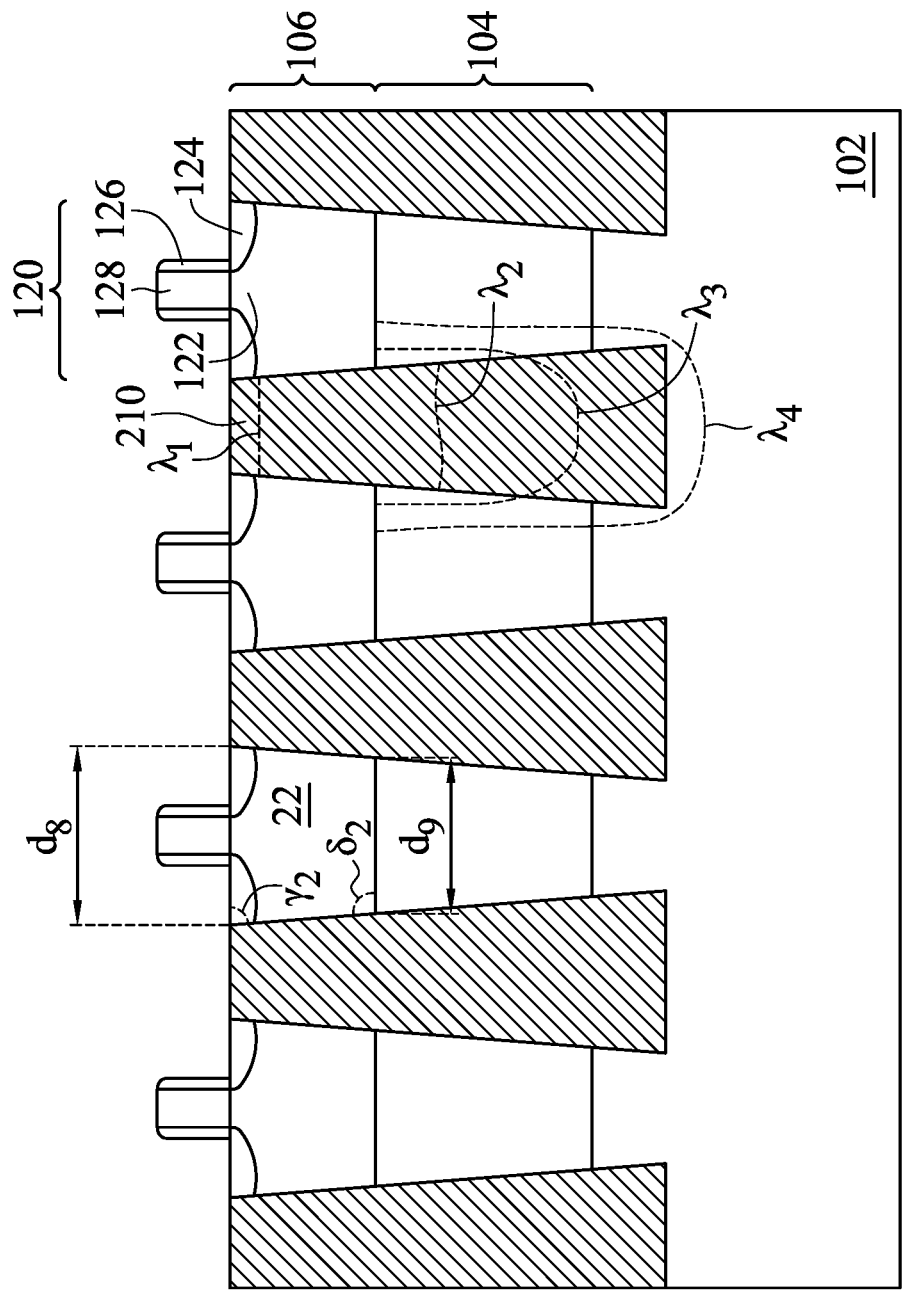
FIGS. 19 through 20 illustrate a device in an intermediate stage of formation, in accordance with some embodiments.
Figure 20:
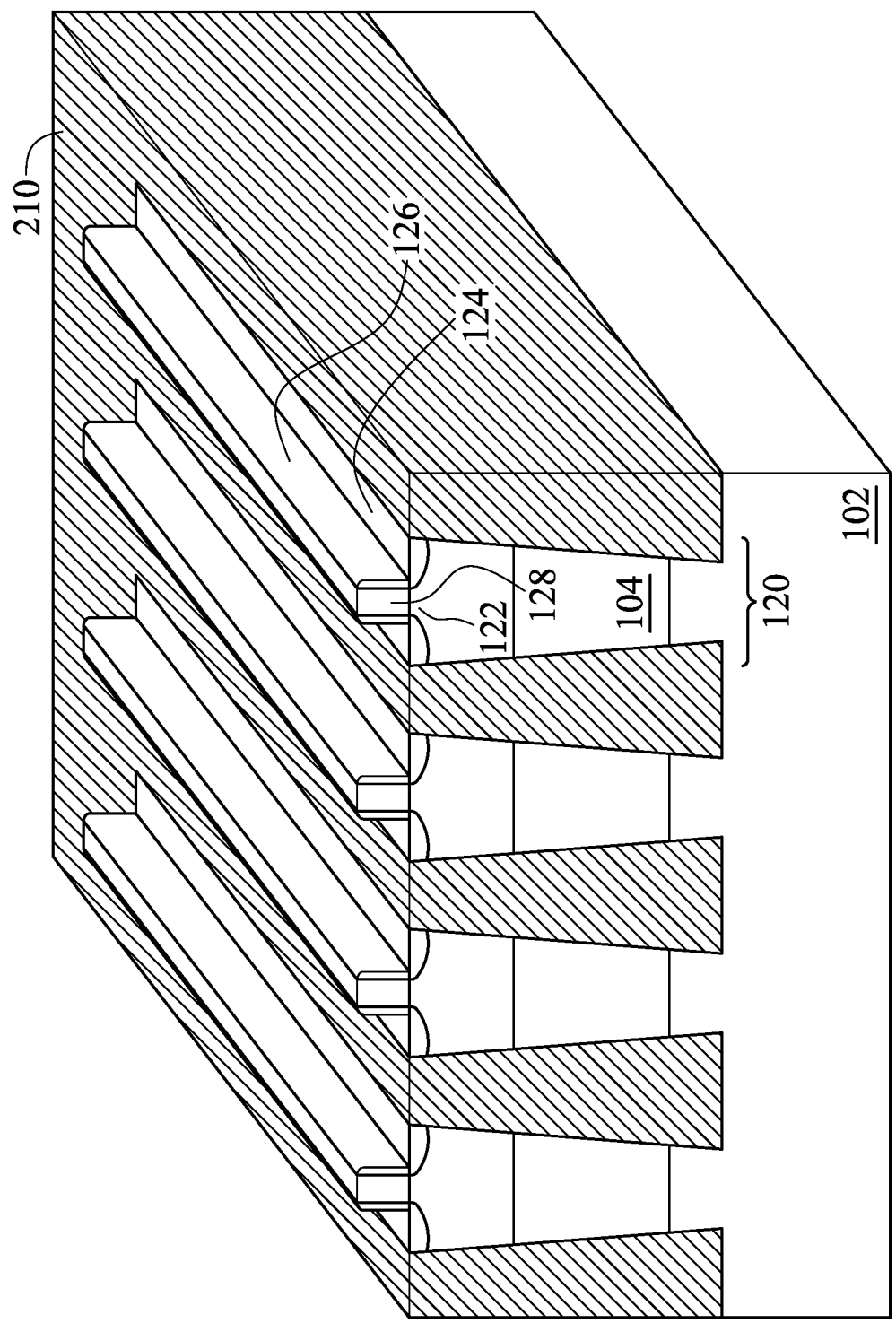

Referring to FIGS. 19 and 20, FIGS. 19 and 20 illustrate a device in an intermediate stage of formation, in accordance with some embodiments. The isolation structures 210 of FIG. 19 may be formed according to the processes discussed above with respect to FIG. 6.

Resulting device regions 22 between adjacent isolation structures 210 may be tapered inverse to the shape of the isolation structures 210. A top angle $\gamma_2$ of device region 22, measured from a top surface of device region 22 to a side wall of device region 22, may be less than 90°, such as between about 65° and 90°. A bottom angle $\delta_2$ of device region 22, measured from a bottom surface of device region 22 to a side wall of device region 22 may be greater than 90°, such as between about 90° and 135° Other angles may be used. A width $d_8$ of device region 22 at a TCD of device region 22 may be between about 100 nm and 400 nm. A width $d_9$ of device region at a BCD of device region 22 may be between about 65 nm and 300 nm. Other dimensions greater or less than these may be used. The TCD of device region 22 is greater than the BCD of device region 22. The ratio of TCD to BCD of device region 22 may be between about 1.05 and 1.5.

Subsequently, devices, such as transistor 120, may be formed in the device regions 22 of top semiconductor layer 106, resulting in channel regions 122 of transistor 120. Transistor 120 may be formed in a manner and with materials similar to those discussed above with respect to FIG. 17.

Similar to that discussed above with respect to FIG. 17, $\lambda_1$, $\lambda_2$, $\lambda_3$, and $\lambda_4$ of FIG. 19 each represent close-talk or cross-talk effects at different areas of the isolation structure 210. $\lambda_1$ includes close-talk effects, such as capacitance coupling and resistive leakage, at the TCD of isolation structure 210. $\lambda_2$ includes close-talk effects at a mid-portion of isolation structure 210. $\lambda_3$ includes close-talk effects at a BCD of isolation structure 210. $\lambda_4$ includes close-talk effects through substrate 102. Because the BCD of isolation structure 210 is greater than the TCD, the close-talk effects decrease the deeper into isolation structure. In contrast, in a positively-sloped isolation structure, the close-talk effects increase as the isolation structure tapers, causing the device area of neighboring devices to become closer to each other.

Referring to FIG. 20, a perspective view of the device of FIG. 19 is illustrated, in accordance with some embodiments. Devices such as transistor 120 are formed in a top semiconductor layer 106 and are separated by isolation structures 210 having negatively sloped side walls. Isolation structures 210 may be used in place of positively sloped isolation structures without negatively impacting channel length or other aspects of transistor 120. A more effective isolation structure is therefore achieved. Because the TCD of the isolation structure 210 may be the same as the TCD of a typically used isolation structure, a gain in isolation strength can be achieved in the same critical dimension of the active devices 120. Isolation strength increases as depth into the isolation structure 210 increases.

Figure 21:
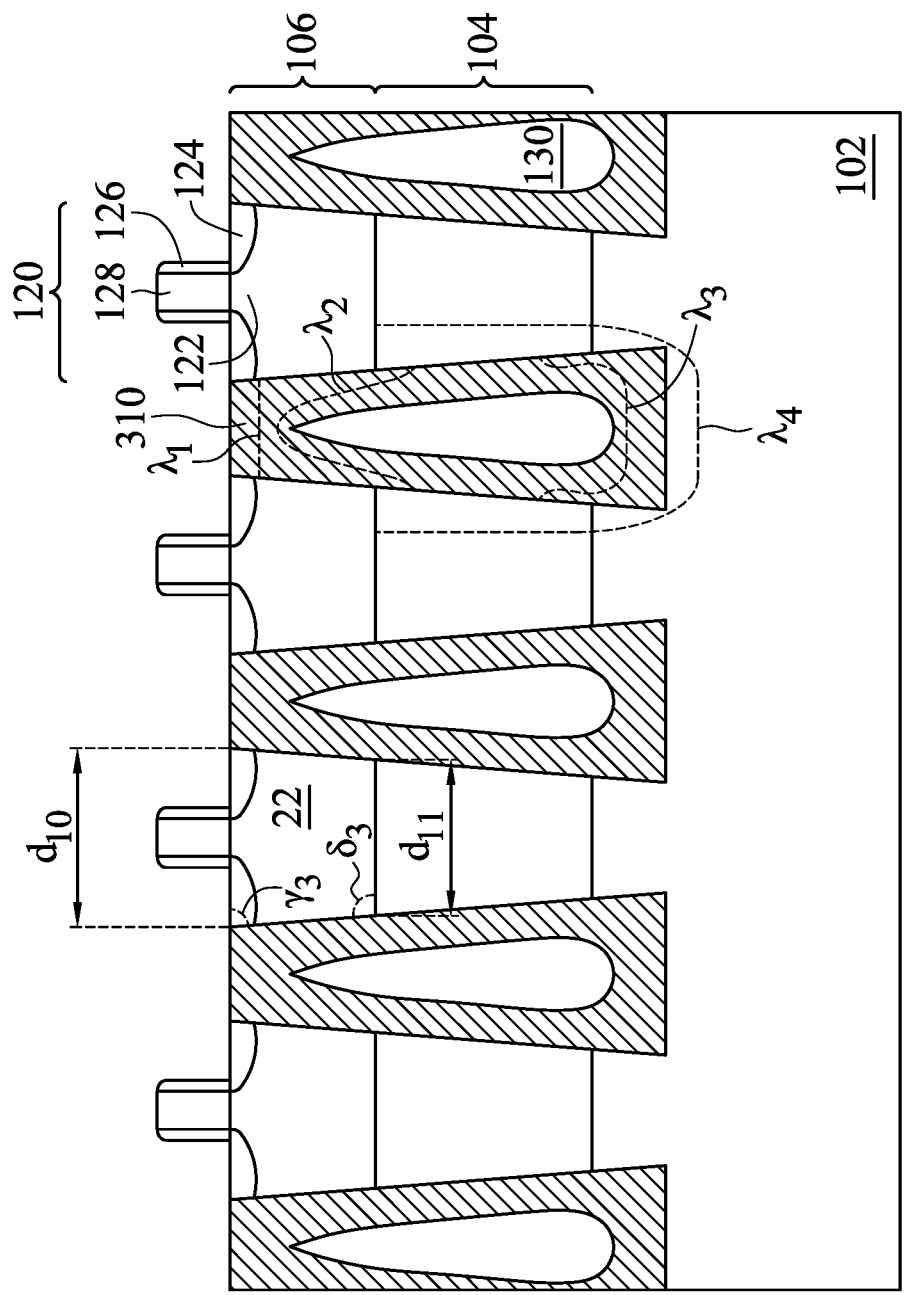
FIGS. 21 through 22 illustrate a device in an intermediate stage of formation, in accordance with some embodiments.
Figure 22:
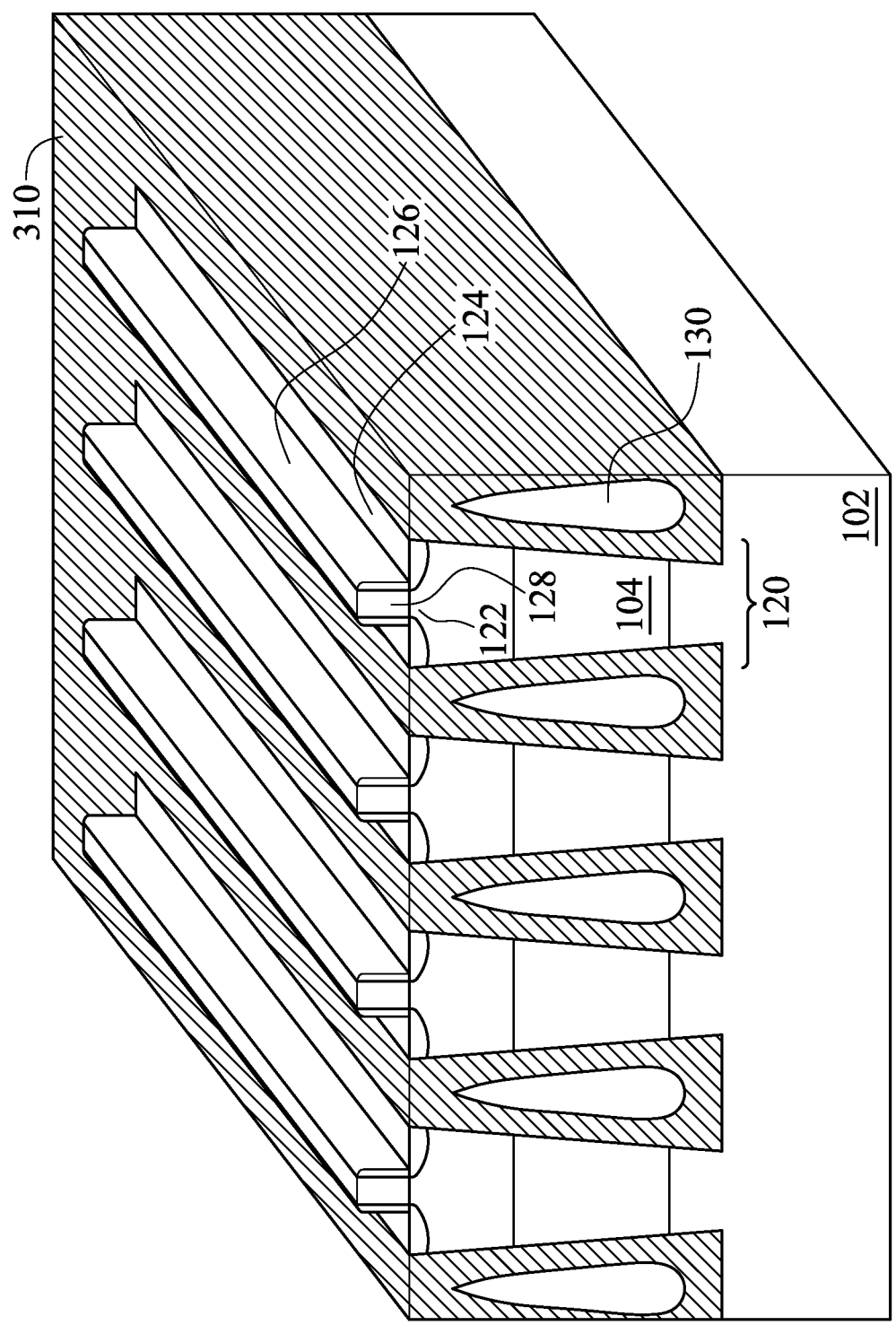

Referring to FIGS. 21 and 22, FIGS. 21 and 22 illustrate a device in an intermediate stage of formation, in accordance with some embodiments. The isolation structures 310 of FIG. 21 may be formed according to the processes discussed above with respect to FIG. 7.

Resulting device regions 22 between adjacent isolation structures 210 may be tapered inverse to the shape of the isolation structures 210. A top angle $\gamma_3$ of device region 22, measured from a top surface of device region 22 to a side wall of device region 22, may be less than 90°, such as between about 65° and 90°. A bottom angle $\delta_3$ of device region 22, measured from a bottom surface of device region 22 to a side wall of device region 22 may be greater than 90°, such as between about 90° and 135° Other angles may be used. A width $d_{10}$ of device region 22 at a TCD of device region 22 may be between about 100 nm and 400 nm. A width $d_{11}$ of device region at a BCD of device region 22 may be between about 65 nm and 300 nm. Other dimensions greater or less than these may be used. The TCD of device region 22 is greater than the BCD of device region 22. The ratio of TCD to BCD of device region 22 may be between about 1.05 and 1.5.

Subsequently, devices, such as transistor 120, may be formed in the device region 22 of top semiconductor layer 106, resulting in channel region 122 of transistor 120. Transistor 120 may be formed in a manner and with materials similar to those discussed above with respect to FIG. 17.

Similar to that discussed above with respect to FIG. 17, $\lambda_1$, $\lambda_2$, $\lambda_3$, and $\lambda_4$ of FIG. 21 each represent close-talk or cross-talk effects at different areas of the isolation structure 310. $\lambda_1$ includes close-talk effects, such as capacitance coupling and resistive leakage, at the TCD of isolation structure 310. $\lambda_2$ includes close-talk effects at a mid-portion of isolation structure 310. $\lambda_3$ includes close-talk effects at a BCD of isolation structure 310. $\lambda_4$ includes close-talk effects through substrate 102. Because the BCD of isolation structure 310 is greater than the TCD, the close-talk effects decrease the deeper into isolation structure. In contrast, in a positively-sloped isolation structure, the close-talk effects increase as the isolation structure tapers, causing the device area of neighboring devices to become closer to each other. Moreover, air gaps 130 further inhibit close-talk effects causing a resistive leakage path through isolation structure 310 to increase disproportionately in length, thereby increasing resistance and correspondingly decreasing leakage. In contrast, in a positively-sloped isolation structure an air gap is difficult to achieve because the TCD of the isolation structure is greater than the BCD.

Referring to FIG. 22, a perspective view of the device of FIG. 21 is illustrated, in accordance with some embodiments. Devices such as transistor 120 are formed in a top semiconductor layer 106 and are separated by isolation structures 310 having negatively sloped side walls. Isolation structures 310 may be used in place of positively sloped isolation structures without negatively impacting channel length or other aspects of transistor 120. A more effective isolation structure is therefore achieved. Because the TCD of the isolation structure 310 may be the same as the TCD of a typically used isolation structure, a gain in isolation strength can be achieved in the same critical dimension of the active devices 120. Isolation strength increases as depth into the isolation structure 310 increases.

Figure 23:
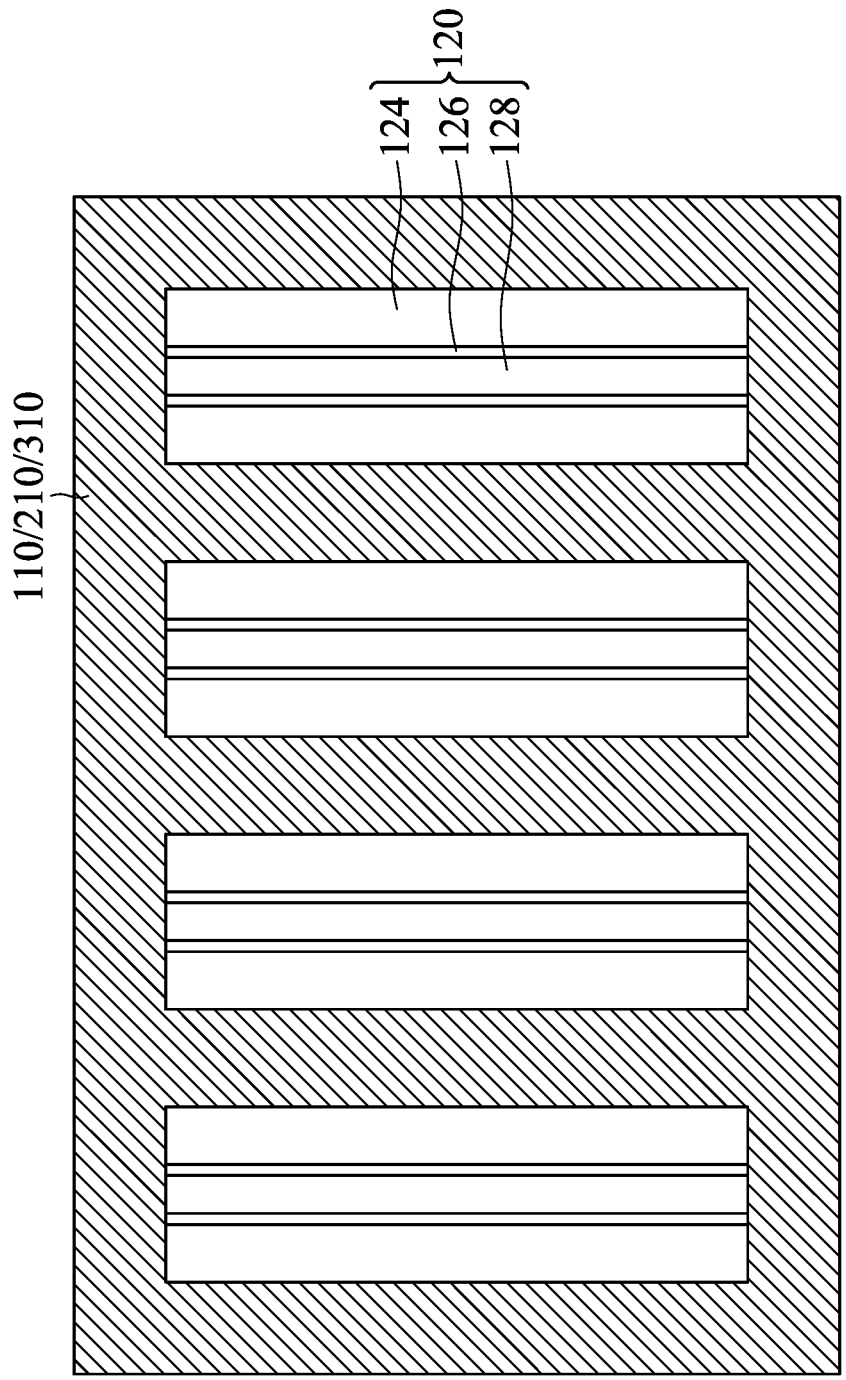
FIG. 23 illustrates a partial top down view of the devices of FIGS. 17, 19, and 21, in accordance with some embodiments.

FIG. 23 illustrates a partial top down view of the devices of FIGS. 17, 19, and 21, in accordance with some embodiments. It should be understood that the view of FIG. 23 may be part of a wafer. Isolation structure 110, 210, or 310 surround devices 120 which include source/drain regions 124, gate spacers 126, and gate electrode 128. The length of trenches 24 (see FIG. 3) or trenches 44 (see FIG. 5) and the subsequently formed isolation structures formed therein may vary based on the design of the transistor 120 or other formed devices. As seen in FIG. 23, isolation structures 110, 210, or 310 may continue around the ends of the device region 22. At the ends of device regions 22, isolation structures 110, 210, or 310 may have negatively sloped sidewalls. In some embodiments, however, isolation structures 110, 210, or 310 may have substantially straight sidewalls or positively sloped sidewalls at the ends of device region 22.

In some embodiments, the critical dimension of the devices may be decreased due to increased isolation strength over traditionally formed isolation regions. In some embodiments, the critical dimension of the devices using isolation structures 110, 210, or 310 may remain the same as the critical dimension found in devices using traditionally formed isolation regions, but isolation is improved. In some embodiments, the critical dimension of the devices using isolation structures 110, 210, or 310 may remain the same as the critical dimension found in devices using traditionally formed isolation regions. However, because isolation resulting from process embodiments is greater, less costly insulating materials can be selected to achieve an isolation effect in isolation structures 110, 210, or 310 which is comparable to the isolation effect achieved in traditionally formed isolation regions but with costlier insulating materials. In other words, embodiments may use less costly insulating materials while achieving a similar isolation effect as in traditionally formed isolation regions.

Figure 24:
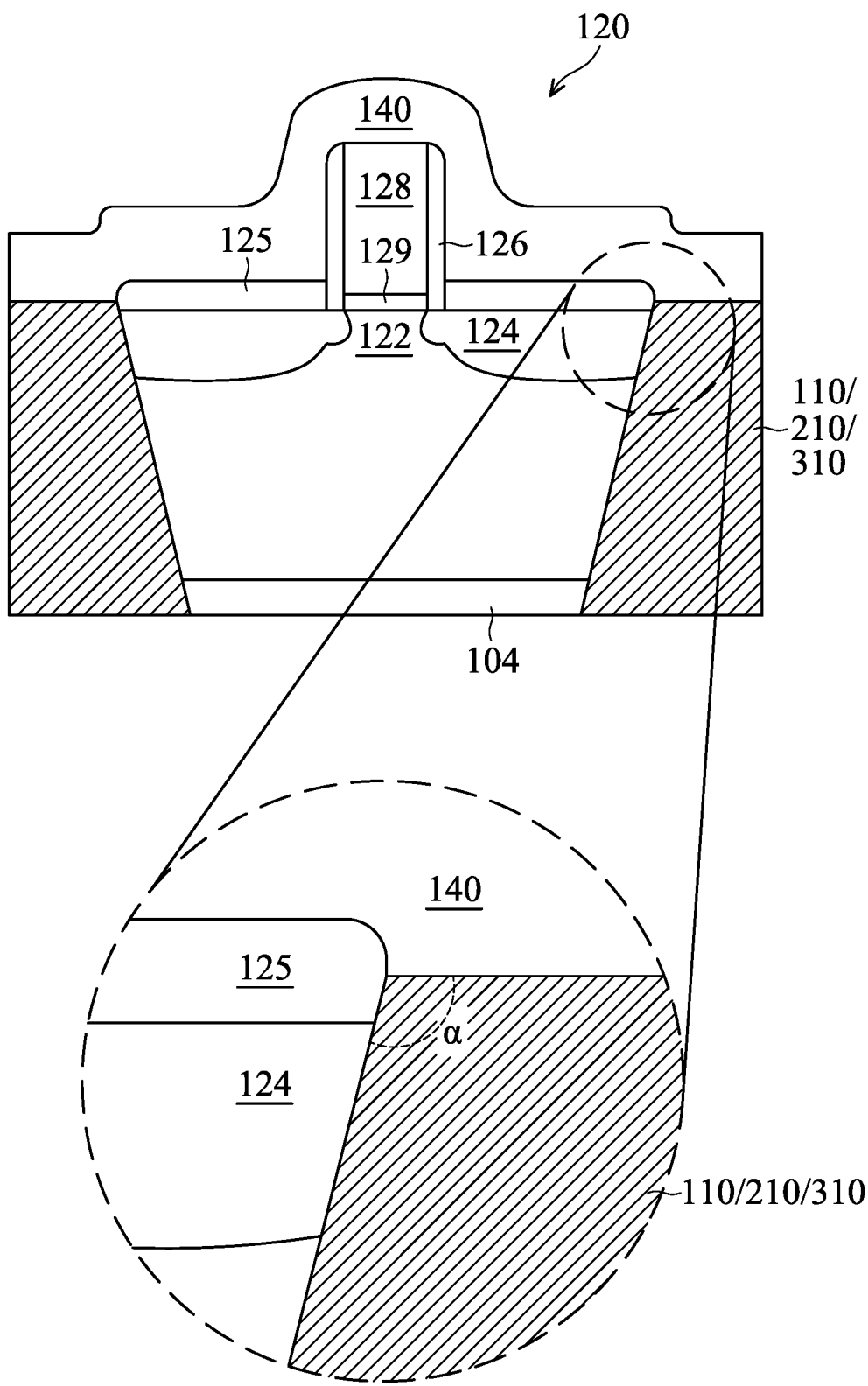
FIG. 24 illustrates a partial cross-section of a transistor device which uses negatively sloped isolation structures, in accordance with some embodiments.

FIG. 24 illustrates a partial cross-section of a transistor device 120 which uses negatively sloped isolation structures, in accordance with some embodiments. A channel 122 is formed from top semiconductor layer 106. Isolation structures 110, 210, or 310 are provided on either side of the device and extend at least partially into an insulator layer 104. Transistor 120 includes source/drain regions 124, source/drain silicide regions 125, gate spacers 126, gate dielectric 129, and gate electrode 128. An ILD 140 is formed over transistor 120. Contacts (not shown) may be formed through the ILD 140 to contact gate electrode 128 and source/drain silicide regions 125.

A call out is provided which magnifies the interface between the isolation structures, source/drain regions, and source/drain silicide regions. The angle at is greater than 90°, representing that the isolation structure is negatively sloped. Observations of test devices consistent with the embodiments discussed herein (having a negatively sloped isolation structure) have shown improved isolation over devices not having a negatively sloped isolation structure.

Embodiments provide a way of improving isolation strength of an isolation structure in a device without having to choose stronger isolation materials at greater expense or without having to increase critical dimension of the device. In some devices, isolation is more important than in others, such as with RF devices. Embodiments provide a negatively sloped isolation structure that flares wider as it penetrates deeper into a top semiconductor layer of an SOI base, thereby increasing isolation strength of the isolation structure as it goes deeper into the surrounding material.

Although the embodiments have been described in terms of a semiconductor device on an SOI substrate, one of skill will understand that aspects of this disclosure including a negatively sloped isolation region may be used in other device and substrate types.

One embodiment is a method including patterning a mask over a semiconductor layer of a substrate. A trench is etched through the mask, where the trench has a top opening having a first width and a bottom having a second width, where the second width is greater than the first width. An insulating material is deposited in the trench, where the insulating material flares from the first width to the second width.

Another embodiment is a method including etching a first trench and a second trench in a semiconductor substrate, the first trench being separated from the second trench by a first device area of the semiconductor substrate. An insulating material is deposited in the first trench and in the second trench to form a first isolation structure and a second isolation structure, respectively, where an angle between a first sidewall of the first isolation structure and a top surface of the first isolation structure is greater than 90°.

Another embodiment is a structure including a semiconductor material layer, a first isolation structure embedded in the semiconductor material layer, and a second isolation structure embedded in the semiconductor material layer, where the first isolation structure and second isolation structure each have a top width and a bottom width, where the bottom width is greater than the top width. The structure further includes a device region disposed between the first isolation structure and the second isolation structure, where the device region has a device formed therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   patterning a mask over a semiconductor layer, the semiconductor layer being disposed over a substrate;
   performing a first etch process to etch a trench in the semiconductor layer through the mask, wherein as a result of the first etch process, sidewalls of the trench slope inwardly from a top of the trench to a bottom of the trench, the top of the trench being at an upper surface of the semiconductor layer;
   performing a second etch process on the semiconductor layer, wherein the second etch process is different than the first etch process, wherein the second etch process widens the bottom of the trench in the semiconductor layer, wherein as a result of the second etch process;
   the top has a first width and the bottom has a second width, wherein the second width is greater than the first width;
   the sidewalls of the trench slope change from sloping inwardly from the top of the trench to the bottom of the trench to sloping outwardly from the top of the trench to the bottom of the trench; and
   the sidewalls of the trench slope outwardly from the top of the trench to the bottom of the trench; and
   depositing an insulating material in the trench, wherein a sidewall of the insulating material flares from the first width to the second width.

2. The method of claim 1, wherein the trench has a bottom surface which is deeper than a thickness of the semiconductor layer over the substrate.

3. The method of claim 2, wherein the trench extends through an insulator layer underlying the semiconductor layer.

4. The method of claim 3, wherein the trench extends deeper than the insulator layer into the substrate.

5. The method of claim 3, wherein depositing the insulating material forms an air gap therein.

6. The method of claim 1, wherein:
   the first etch process is a dry etch process; and
   the second etch process is a wet etch process.

7. The method of claim 1, further comprising:
   following depositing the insulating material, planarizing a top surface of the semiconductor layer with a top surface of the insulating material.

8. The method of claim 7, further comprising:
   forming a radio frequency (RF) device in the semiconductor layer adjacent the insulating material, wherein the RF device has a first interface with the insulating material.

9. The method of claim 1, wherein an angle between a sidewall of the trench and a bottom surface of the trench is less than 90 degrees.

10. A method comprising:
   etching a first trench and a second trench in a semiconductor substrate, the first trench separated from the second trench by a first device area of the semiconductor substrate, a top of the first trench having a first width, a bottom of the first trench having a second width, ratio of the first width to the second width is in a range of 0.6 to 0.95;
   etching a third trench in the semiconductor substrate, a top of the third trench has a third width, a bottom of the third trench having a fourth width, the third width is greater than the fourth width, the first width, the second width, the third width, and the fourth width each being measured in a same cross-section of the semiconductor substrate; and
   depositing an insulating material in the first trench, in the second trench, and in the third trench to form a first isolation structure, a second isolation structure, and a third isolation structure, respectively, wherein an angle between a first sidewall of the first isolation structure and a top surface of the first isolation structure where the first sidewall adjoins the top surface of the first isolation structure is greater than 90 degrees, and wherein the top surface of the first isolation structure is level with or extends above an upper surface of the semiconductor substrate.

11. The method of claim 10, wherein the etching comprises:
etching the semiconductor substrate by a dry etching technique; and
after etching the semiconductor substrate by the dry etching technique, etching the semiconductor substrate by a wet etching technique.

12. The method of claim 10, wherein the semiconductor substrate comprises a first substrate, an insulator layer over the first substrate, and a first semiconductor layer over the insulator layer to form a silicon-on-insulator arrangement, and wherein the first trench and second trench completely traverse the first semiconductor layer and the insulator layer of the semiconductor substrate.

13. The method of claim 12, wherein the first trench and the second trench break through a top surface of the first substrate.

14. The method of claim 10, wherein a ratio of a height of the first isolation structure to a width of a top surface of the first isolation structure is between 0.5 and 10.

15. The method of claim 14, wherein the ratio is between 4 and 10.

16. The method of claim 15, further comprising:
forming a first air gap embedded in the first isolation structure.

17. A method comprising:
forming an insulating layer over a substrate;
forming a semiconductor material layer over the insulating layer;
depositing a mask layer over the semiconductor material layer;
patterning the mask layer;
using the insulating layer as a first etch stop, performing a first etch to form a trench in the semiconductor material layer corresponding to the pattern of the mask layer;
using the substrate as a second etch stop, performing a second etch to extend the trench through the semiconductor material layer;
performing a third etch, the third etch widening a bottom of the trench, wherein following the third etch a ratio of a first width of the trench to a second width of the trench is between 0.6 and 0.95, the first width corresponding to a width of the trench at a top of the trench, the second width corresponding to a width of the trench at the bottom of the trench; and
forming a first isolation structure in the trench, the first isolation structure having negatively sloped sidewalls.

18. The method of claim 17, further comprising:
forming an air gap embedded in the first isolation structure.

19. The method of claim 17, further comprising:
forming a device in the semiconductor material layer adjacent the first isolation structure.

20. The method of claim 17, further comprising:
masking a first area of the semiconductor material layer to protect it from the first etch, wherein the first etch is performed on a second area of the semiconductor material layer; and
forming a second isolation structure in the first area of the semiconductor material layer, the second isolation structure having non-negatively sloped sidewalls.

* * * * *